(12) United States Patent
Chuang et al.

(10) Patent No.: US 11,557,549 B2
(45) Date of Patent: Jan. 17, 2023

(54) METHOD OF MANUFACTURING SEMICONDUCTOR STRUCTURE HAVING DUMMY PATTERN AROUND ARRAY AREA

(71) Applicant: NANYA TECHNOLOGY CORPORATION, New Taipei (TW)

(72) Inventors: Ying-Cheng Chuang, Taoyuan (TW); Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/563,267

(22) Filed: Dec. 28, 2021

(65) Prior Publication Data
US 2022/0122928 A1   Apr. 21, 2022

Related U.S. Application Data

(62) Division of application No. 16/902,726, filed on Jun. 16, 2020, now Pat. No. 11,315,887.

(51) Int. Cl.
*H01L 23/00* (2006.01)
*H01L 21/308* (2006.01)
*H01L 21/311* (2006.01)

(52) U.S. Cl.
CPC ........ *H01L 23/564* (2013.01); *H01L 21/3086* (2013.01); *H01L 21/31144* (2013.01)

(58) Field of Classification Search
CPC .......... H01L 21/3086; H01L 21/31144; H01L 23/564
See application file for complete search history.

(56) References Cited

U.S. PATENT DOCUMENTS

2020/0020782 A1\* 1/2020 Ching ............... H01L 21/76224

\* cited by examiner

*Primary Examiner* — Walter H Swanson
(74) *Attorney, Agent, or Firm* — Xuan Zhang

(57) ABSTRACT

The present disclosure provides a method of manufacturing a semiconductor structure. The method includes providing a substrate defined with a peripheral region and an array area at least partially surrounded by the peripheral region; disposing an insulating layer over the substrate; disposing a capping layer over the insulating layer; disposing a hardmask stack on the capping layer; patterning the hardmask stack; removing portions of the capping layer exposed through the hardmask stack; removing portions of the insulating layer exposed through the hardmask stack; removing portions of the substrate exposed through the capping layer and the insulating layer to form a plurality of fins in the array area and a first elongated member at least partially surrounding the plurality of fins; removing the hardmask stack; and forming an isolation over the substrate and surrounding the plurality of fins and the first elongated member.

18 Claims, 38 Drawing Sheets

METHOD OF MANUFACTURING SEMICONDUCTOR STRUCTURE HAVING DUMMY PATTERN AROUND ARRAY AREA

CROSS-REFERENCE TO RELATED APPLICATION

This application is a divisional application of U.S. Non-Provisional application Ser. No. 16/902,726 filed Jun. 16, 2020, which is incorporated herein by reference in its entirety.

TECHNICAL FIELD

The present disclosure relates to a method of manufacturing a semiconductor structure. Particularly, the present disclosure relates to a method of manufacturing a semiconductor structure having a dummy pattern around an array area of a substrate and configured to relieve stress internal to the array area.

DISCUSSION OF THE BACKGROUND

Semiconductor devices and integrated circuits are becoming more highly integrated. The fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve the integration density of the microelectronic components by continual reduction of minimum feature size, which allows more components to be integrated into a given area. Smaller package structures with smaller footprints are developed to package the semiconductor devices. In semiconductor memory devices, as the memory capacity of such devices increases, a critical dimension of patterns in the device is reduced. Such reduction may induce internal stress and may result in misalignment or damage to the elements in the device. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate defined with a peripheral region and an array area at least partially surrounded by the peripheral region, wherein the substrate includes a plurality of fins protruding from the substrate and disposed in the array area, and a first elongated member protruding from the substrate and at least partially surrounding the plurality of fins; an insulating layer disposed over the plurality of fins and the first elongated member; a capping layer disposed over the insulating layer; and an isolation surrounding the plurality of fins, the first elongated member, the insulating layer and the capping layer.

In some embodiments, the first elongated member encircles the plurality of fins.

In some embodiments, the first elongated member has a width in a range between 150 nm and 1000 nm.

In some embodiments, the first elongated member extends along a boundary between the periphery region and the array area.

In some embodiments, the substrate includes a second elongated member protruding from the substrate and at least partially surrounding the plurality of fins.

In some embodiments, the second elongated member is disposed between the first elongated member and the plurality of fins.

In some embodiments, the second elongated member is at least partially disposed between two of the plurality of fins.

In some embodiments, the isolation is disposed between the first elongated member and the second elongated member.

In some embodiments, the plurality of fins, the first elongated member and the second elongated member are integrally formed.

In some embodiments, a top surface of the capping layer is substantially coplanar with a top surface of the isolation.

In some embodiments, the isolation is disposed between two of the plurality of fins.

In some embodiments, the first elongated member is a dummy pattern.

In some embodiments, the insulating layer and the isolation include oxide, and the capping layer includes nitride.

In some embodiments, the substrate includes a plurality of blocks protruding from the substrate, disposed in the peripheral region, covered by the capping layer and surrounded by the isolation.

In some embodiments, the plurality of fins, the first elongated member and the plurality of blocks are integrally formed.

Another aspect of the present disclosure provides a method of manufacturing a semiconductor structure. The method includes steps of providing a substrate defined with a peripheral region and an array area at least partially surrounded by the peripheral region; disposing an insulating layer over the substrate; disposing a capping layer over the insulating layer; disposing a hardmask stack on the capping layer; patterning the hardmask stack; removing portions of the capping layer exposed through the hardmask stack; removing portions of the insulating layer exposed through the hardmask stack; removing portions of the substrate exposed through the capping layer and the insulating layer to form a plurality of fins in the array area and a first elongated member at least partially surrounding the plurality of fins; removing the hardmask stack; and forming an isolation over the substrate and surrounding the plurality of fins and the first elongated member.

In some embodiments, the formation of the isolation includes performing a planarizing process to expose a top surface of the capping layer through the isolation.

In some embodiments, the patterning of the hardmask stack includes disposing a photoresist over the hardmask stack, and removing portions of the hardmask stack exposed through the photoresist.

In some embodiments, the method includes removing portions of the substrate exposed through the capping layer and the insulating layer to form a second elongated member between the plurality of fins and the first elongated member.

In some embodiments, the plurality of fins, the first elongated member and the second elongated member are formed simultaneously.

In the present disclosure, a dummy pattern in an elongated configuration is formed to surround fins protruding from a substrate and disposed within an array area. A dummy elongated member is formed over the substrate and configured to relieve internal stress developed in an isolation between the fins in the array area. As such, distortion of the fins in the array area can be minimized. Therefore, reliability and overall performance of the semiconductor structure can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
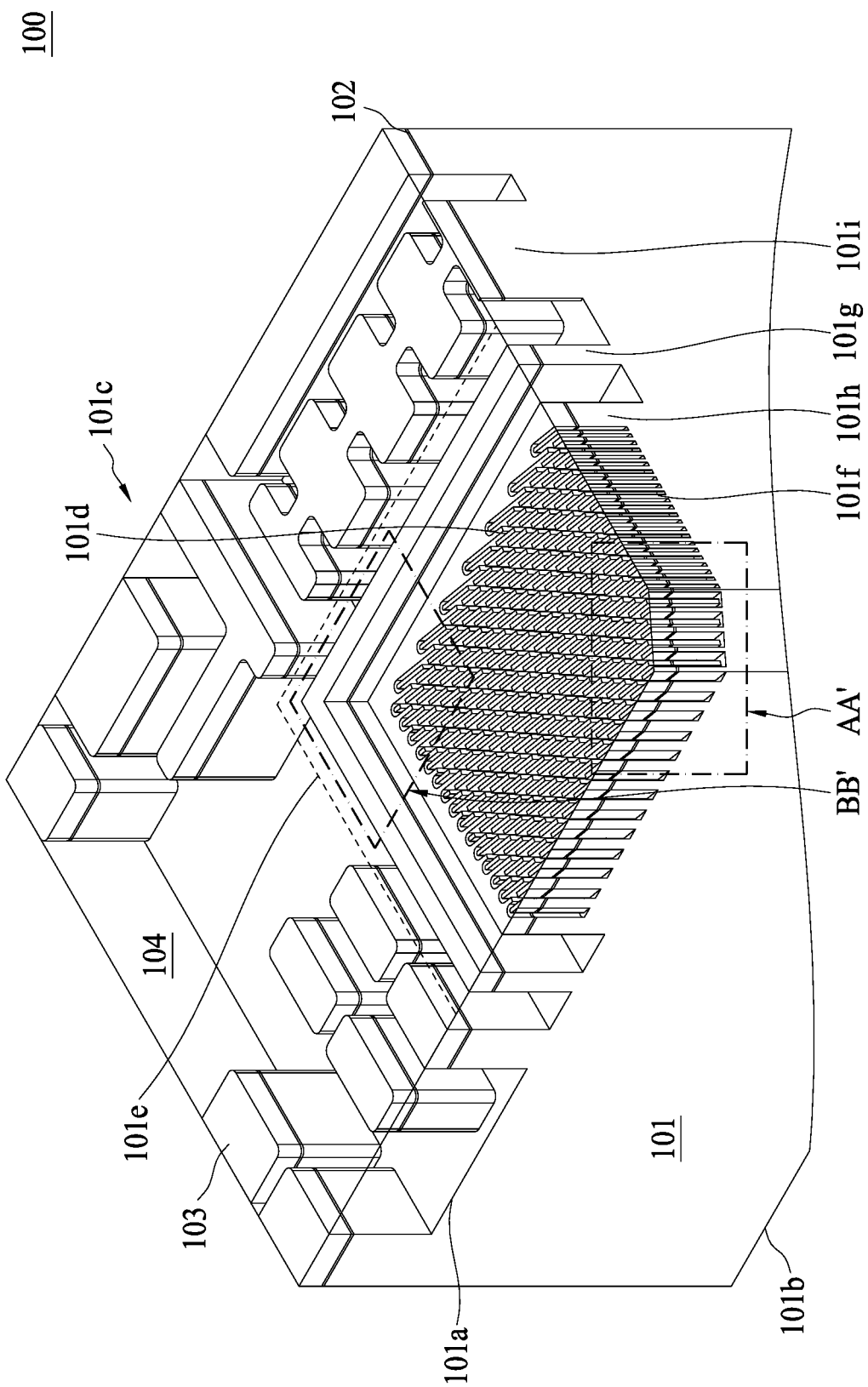
FIG. 1 is a perspective view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
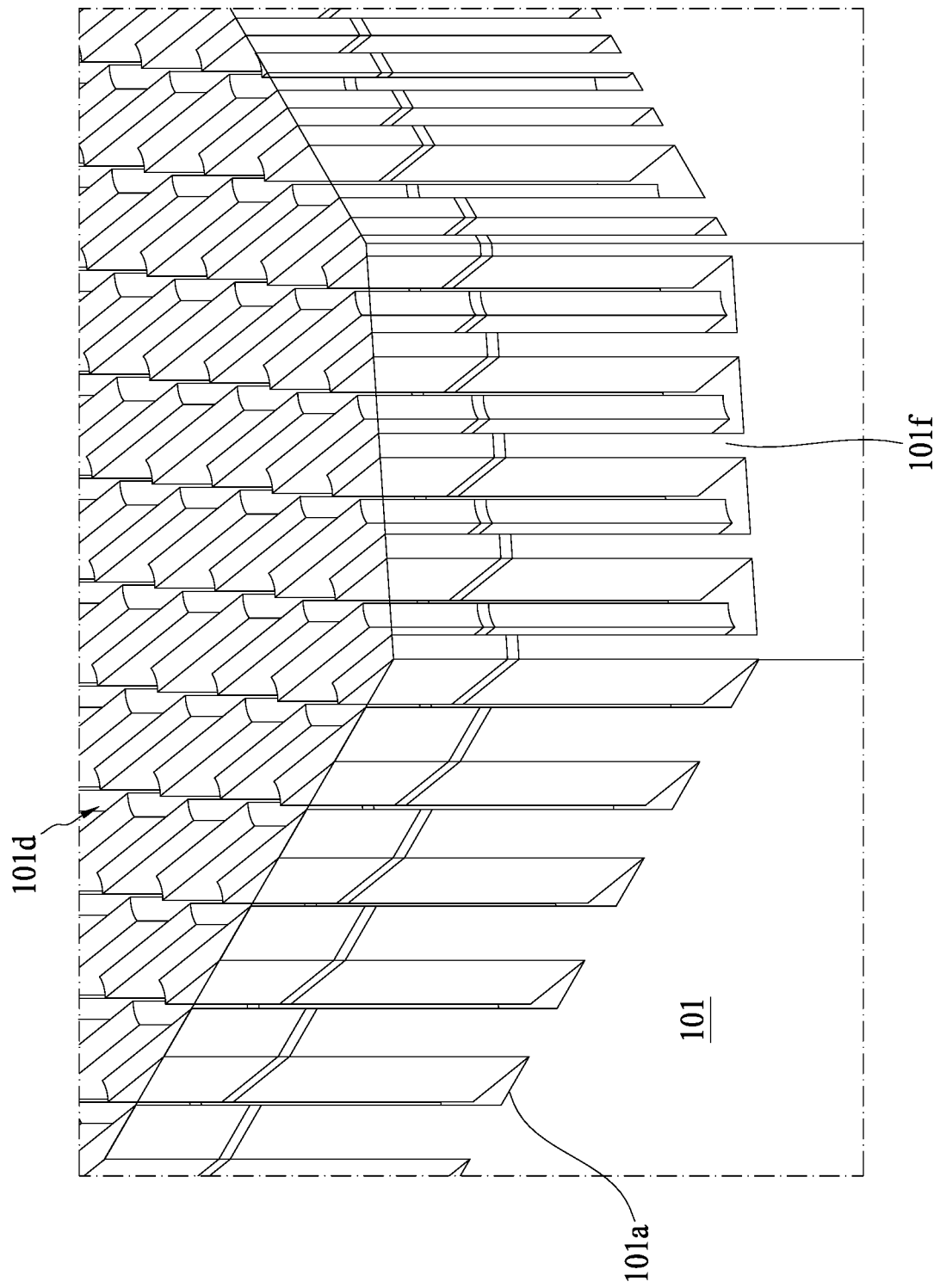
FIG. 2 is an enlarged cross-sectional view of a portion AA' of the semiconductor structure in FIG. 1.
Figure 3:
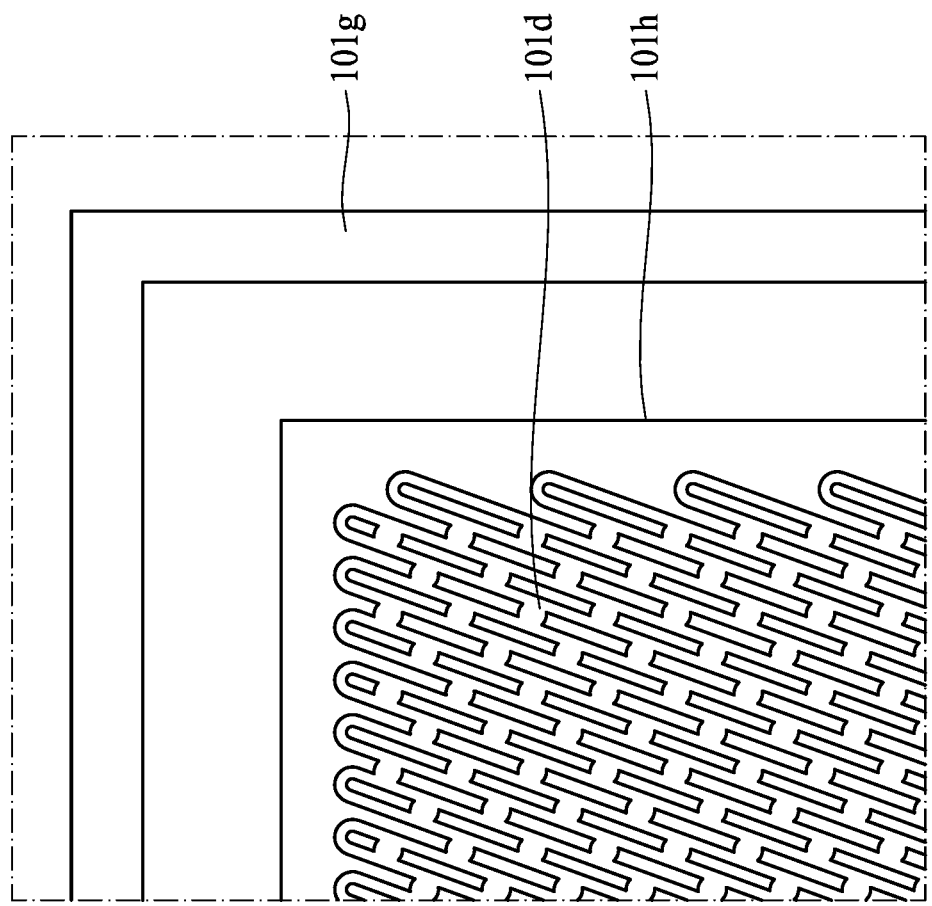
FIG. 3 is an enlarged top view of a portion BB' of the semiconductor structure in FIG. 1 showing a first elongated member in a first configuration.

FIG. 1 is a schematic perspective view of a semiconductor structure 100 in accordance with some embodiments of the present disclosure. Further, FIG. 2 is an enlarged cross-sectional view of a portion AA of the semiconductor structure 100 in FIG. 1, and FIG. 3 is an enlarged top view of a portion BB' of the semiconductor structure 100 in FIG. 1.

In some embodiments, the semiconductor structure 100 is a part of a die, a package or a device. In some embodiments, the semiconductor structure 100 is a part of a memory device. In some embodiments, the semiconductor structure 100 includes a substrate 101, an insulating layer 102, a capping layer 103 and an isolation 104.

In some embodiments, the substrate 101 is a semiconductive substrate. In some embodiments, the substrate 101 includes semiconductive material such as silicon, germanium, gallium, arsenic, or a combination thereof. In some embodiments, the substrate 101 includes bulk semiconductor material. In some embodiments, the substrate 101 is a silicon substrate. In some embodiments, the substrate 101 includes lightly doped monocrystalline silicon. In some embodiments, the substrate 101 is a p-type substrate.

Referring to FIG. 1, the substrate 101 includes a first surface 101a and a second surface 101b opposite to the first surface 101a. In some embodiments, the first surface 101a is a front side of the substrate 101, wherein electrical devices or components are subsequently formed over the first surface 101a and configured to electrically connect to an external circuitry. In some embodiments, the second surface 101b is a back side of the substrate 101, where electrical devices or components are absent.

In some embodiments, the substrate 101 defines a peripheral region 101c and an array area 101d at least partially surrounded by the peripheral region 101c. In some embodiments, the peripheral region 101c is adjacent to a periphery of the substrate 101, and the array area 101d is adjacent to a central area of the substrate 101. In some embodiments, the array area 101d may be used for fabricating field effect vertical transistors. In some embodiments, a boundary 101e is disposed between the peripheral region 101c and the array area 101d.

Referring to FIGS. 1 to 3, the substrate 101 includes several fins 101f, a first elongated member 101g disposed in the array area 101d, a second elongated member 101h surrounding the fins 101f, and several blocks 101i in the peripheral region 101c. In some embodiments, the fins 101f, the first elongated member 101g, the second elongated member 101h and the blocks 101i protrude from the substrate 101 or the first surface 101a of the substrate 101. In some embodiments, the fins 101f, the first elongated member 101g, the second elongated member 101h and the blocks 101i are integrally formed.

In some embodiments, the fins 101f are arranged in an array or matrix. In some embodiments, heights of the fins 101f are consistent with each other. In some embodiments, the height of the fin 101f is in a range between 30 nm and 200 nm. In some embodiments, a pitch between adjacent pairs of fins 101f is consistent. In some embodiments, the fin 101f has a cylindrical shape. In some embodiments, a cross section of the fin 101f has a circular, oval, quadrilateral or polygonal shape.

In some embodiments, the first elongated member 101g partially or entirely surrounds the fins 101f. In some embodiments, the first elongated member 101g encircles the fins 101f. In some embodiments, the first elongated member 101g extends along the boundary 101e between the peripheral region 101c and the array area 101d. In some embodiments, the first elongated member 101g is a dummy pattern, i.e., the first elongated member 101g is electrically isolated from circuit or device of the semiconductor structure 100.

In some embodiments, the first elongated member 101g has a width in a range between 150 nm and 1000 nm. In some embodiments, a distance between the first elongated member 101g and the outermost fin among the fins 101f is in a range between 100 nm and 500 nm. In some embodiments, a top cross section of the first elongated member 101g is in a strip, frame or ring configuration. In some embodiments, the height of the fins 101f is substantially same as a height of the first elongated member 101g.

Figure 4:
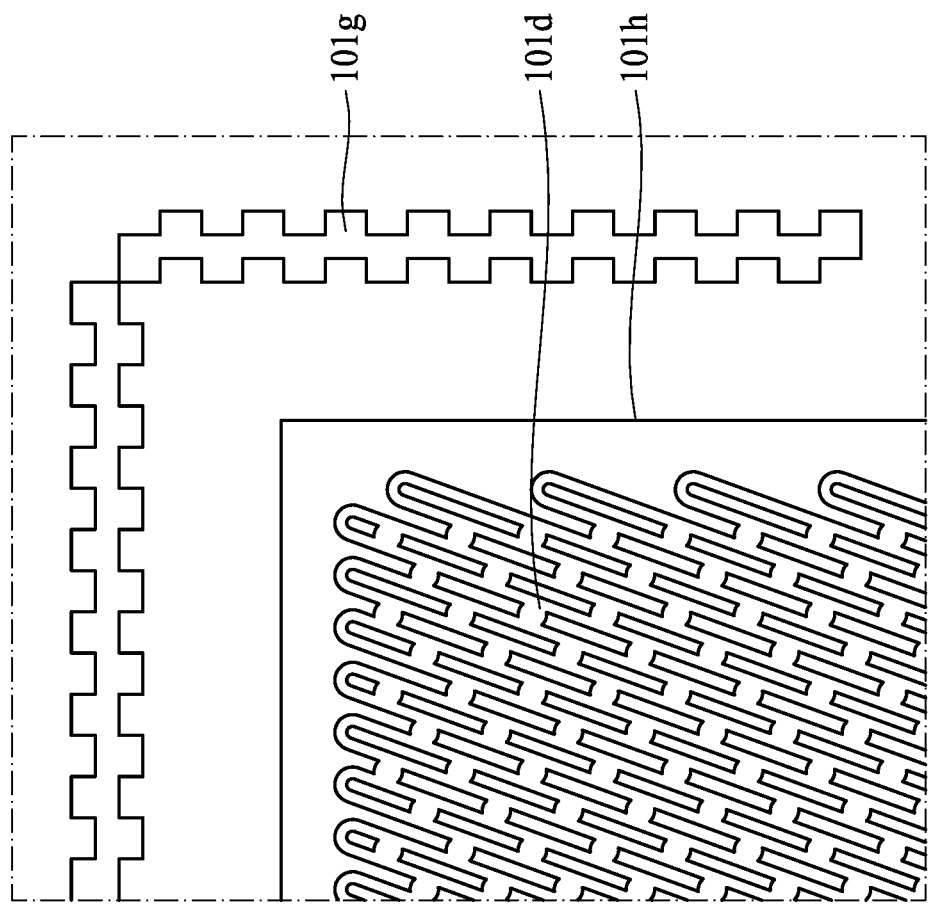
FIG. 4 is an enlarged top view of the portion BB' of the semiconductor structure in FIG. 1 showing the first elongated member in a second configuration.
Figure 5:
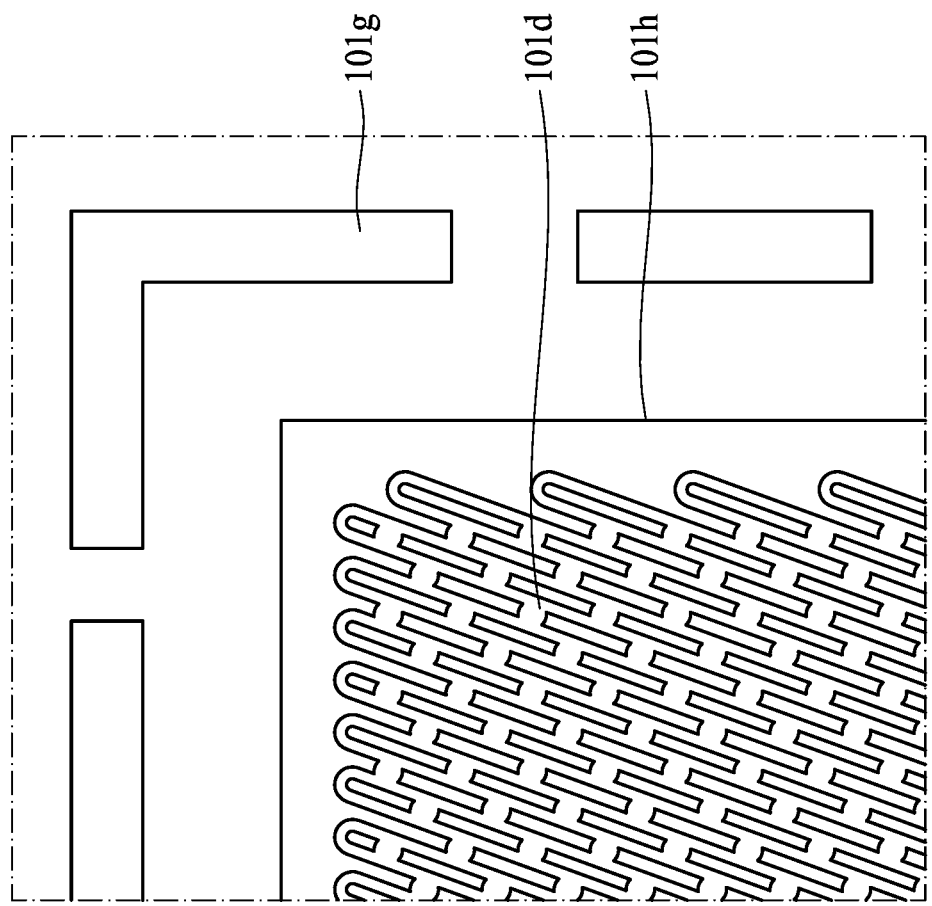
FIG. 5 is an enlarged top view of a portion BB' of the semiconductor structure in FIG. 1 showing the first elongated member in a third configuration.

Referring to FIGS. 3 to 5, the first elongated member 101g can be in various configurations. In some embodiments, as shown in FIG. 3, the first elongated member 101g surrounds the fins 101f in a strip configuration. In some embodiments, as shown in FIG. 4, the first elongated member 101g is in a zig-zag configuration. In some embodiments, as shown in FIG. 5, the first elongated member 101g comprises several segments, each of which extends along a portion of the boundary 101e. In some embodiments, the segments are discontinuous and separated from each other.

In some embodiments, the second elongated member 101h partially or entirely surrounds the fins 101f. In some embodiments, the second elongated member 101h encircles the fins 101f. In some embodiments, the second elongated member 101h extends between the first elongated member 101g and the fins 101f. In some embodiments, the second elongated member 101h is at least partially disposed between two of the fins 101f. In some embodiments, the second elongated member 101h is proximal to the fins 101f and distal to the first elongated member 101g.

In some embodiments, the width of the first elongated member 101g is substantially greater than a width of the second elongated member 101h. In some embodiments, the second elongated member 101h has a width in a range between 100 nm and 800 nm. In some embodiments, a distance between the second elongated member 101h and the outermost fin among the fins 101f is in a range between 50 nm and 500 nm. In some embodiments, a top cross section of the second elongated member 101h is in a strip, frame or ring configuration. In some embodiments, the height of the fins 101f is substantially same as a height of the second elongated member 101h. In some embodiments, the height of the first elongated member 101g is substantially same as the height of the second elongated member 101h.

In some embodiments, the blocks 101i protrude from the substrate 101 and are disposed in the peripheral region 101c. In some embodiments, the blocks 101i at least partially surround the array area 101d. In some embodiments, a cross section of the block 101 has a quadrilateral or polygonal shape. In some embodiments, a width of the block 101i is substantially greater than the width of the fin 101f. In some embodiments, the height of the block 101i is substantially same as the height of the fin 101f. In some embodiments, the height of the block 101i is substantially same as the height of the first elongated member 101g.

Referring to FIG. 1, the insulating layer 102 is disposed over the substrate 101. In some embodiments, the insulating layer 102 is disposed in the peripheral region 101c and the array area 101d. In some embodiments, the insulating layer 102 is disposed over the fins 101f, the first elongated member 101g, the second elongated member 101h and the blocks 101i. In some embodiments, the insulating layer 102 covers and contacts the first surface 101a, top surfaces of the fins 101f, a top surface of the first elongated member 101g, a top surface of the second elongated member 101h and top surfaces of the block 101i. In some embodiments, the insulating layer 102 includes oxide.

In some embodiments, the capping layer 103 is disposed over and in contact with the insulating layer 102. In some embodiments, the capping layer 103 is disposed in the peripheral region 101c and the array area 101d. In some embodiments, the capping layer 103 is disposed over the first surface 101a, the top surfaces of the fins 101f, the top surface of the first elongated member 101g, the top surface of the second elongated member 101h and the top surfaces of the block 101i. In some embodiments, the capping layer 103 has a thickness substantially greater than a thickness of the insulating layer 102. In some embodiments, the capping layer 103 includes nitride.

In some embodiments, the isolation 104 surrounds the fins 101f, the first elongated member 101g, the second elongated member 101h, the block 101i, the insulating layer 102 and the capping layer 103. In some embodiments, the isolation 104 is disposed between the first elongated member 101g and the second elongated member 101h, between the fins 101f and the second elongated member 101h, and between the fins 101f. In some embodiments, at least a portion of the top surface of the capping layer 103 is exposed through the isolation 104. In some embodiments, the top surface of the capping layer 103 is substantially coplanar with a top surface of the isolation 104. In some embodiments, the isolation 104 includes oxide. In some embodiments, the insulating layer 102 and the isolation 104 include same or different dielectric materials.

Figure 6:
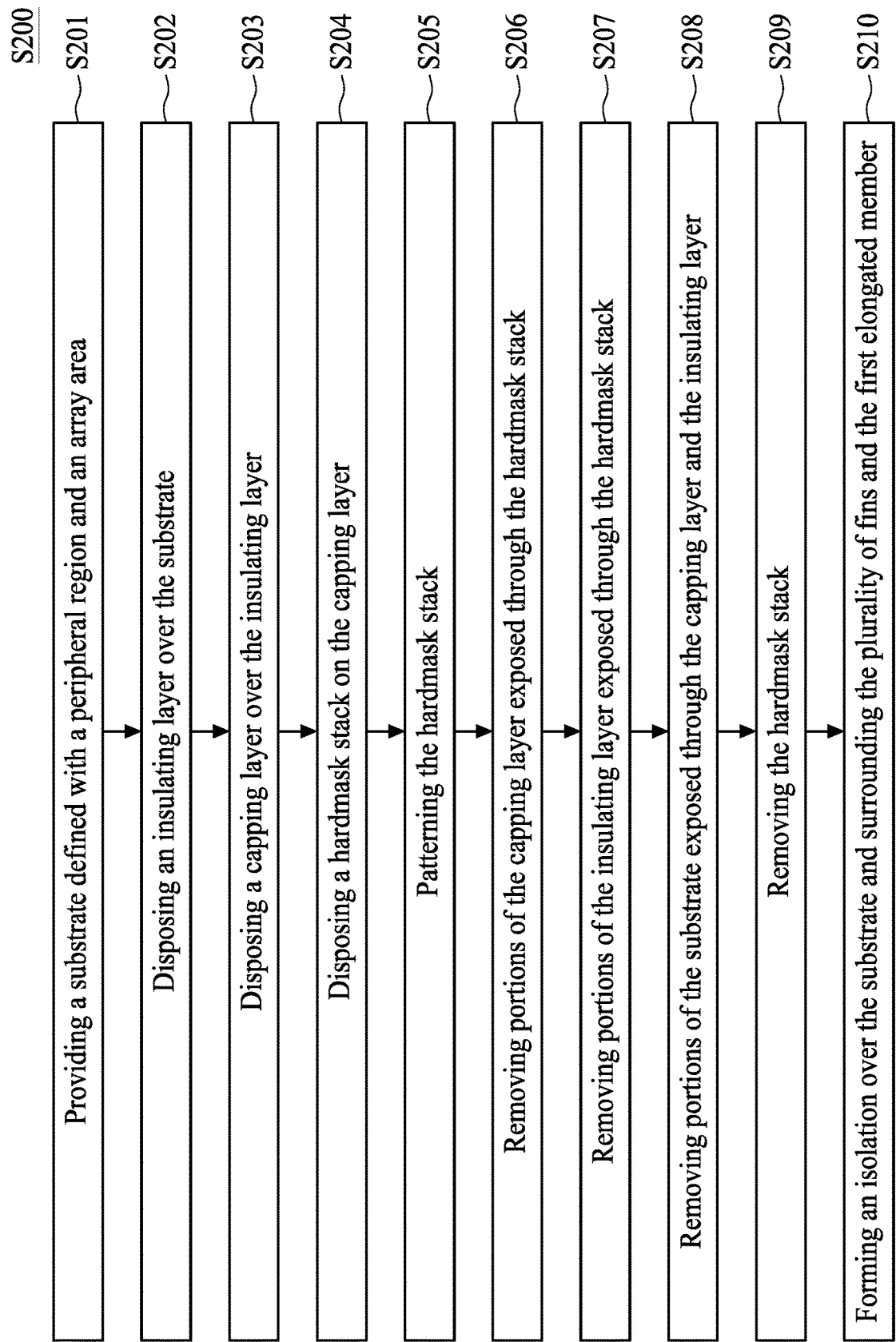
FIG. 6 is a flow diagram illustrating a method of manufacturing a semiconductor structure in accordance with some embodiments of the present disclosure.

FIG. 6 is a flow diagram illustrating a method S200 of manufacturing a semiconductor structure 100 in accordance with some embodiments of the present disclosure. FIGS. 7 to 36 are schematic diagrams illustrating various fabrication stages according to the method S200 for manufacturing the semiconductor structure 100 in accordance with some embodiments of the present disclosure. The stages shown in FIGS. 7 to 36 are also illustrated schematically in the flow diagram in FIG. 6. In the subsequent discussion, the fabrication stages shown in FIGS. 7 to 36 are discussed in reference to the steps shown in FIG. 6. The method S200 includes a number of operations and the description and illustration are not deemed as a limitation of the sequence of the operations. The method S200 includes a number of steps (S201, S202, S203, S204, S205, S206, S207, S208, S209 and S210).

Figure 7:
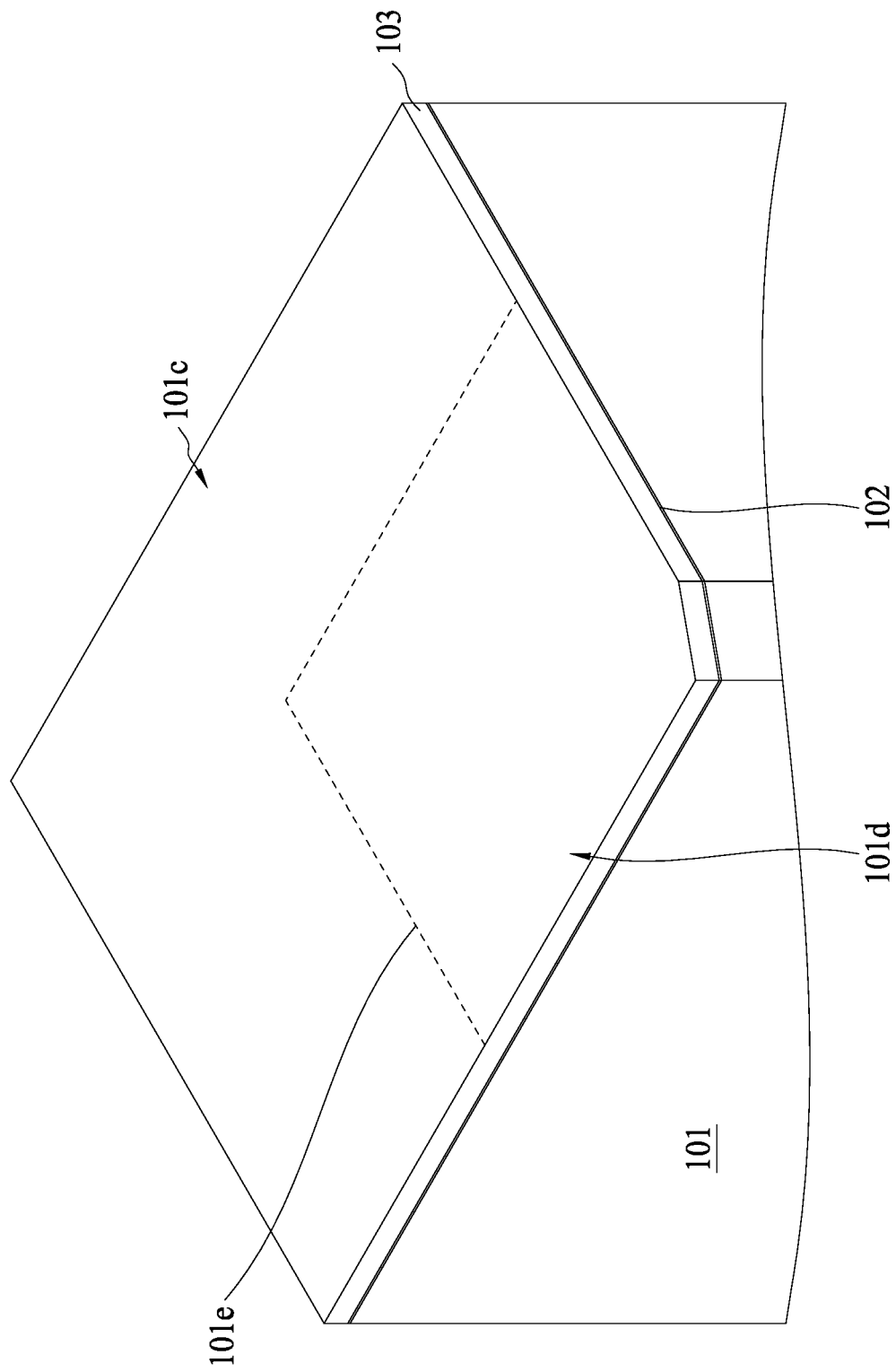
FIGS. 7 through 38 illustrate cross-sectional views of intermediate stages in the manufacturing of a semiconductor structure in accordance with some embodiments of the present disclosure.

Referring to FIG. 7, a substrate 101 is provided or received according to step S201 in FIG. 6. In some embodiments, the substrate 101 includes bulk semiconductor material, for example silicon. In some embodiments, the substrate 101 may be lightly doped monocrystalline silicon. In some embodiments, the substrate 101 may be a p-type substrate.

In some embodiments, the substrate 101 defines a peripheral region 101c and an array area 101d at least partially surrounded by the peripheral region 101c. In some embodiments, the substrate 101 defines a boundary 101e between the peripheral region 101c and the array area 101d.

Referring to FIG. 7, an insulating layer 102 is disposed over the substrate 101 according to step S202 in FIG. 6. In some embodiments, the insulating layer 120 is in contact with the substrate 101. In some embodiments, the insulating layer 102 includes oxide such as silicon oxide. In some embodiments, the insulating layer 102 is formed using a chemical vapor deposition (CVD) process, a thermal oxidation process or any other suitable process.

Referring to FIG. 7, a capping layer 103 is disposed over the insulating layer 102 according to step S203 in FIG. 6. In some embodiments, the capping layer 103 is disposed on the insulating layer 102. In some embodiments, the capping layer 103 includes nitride, e.g., silicon nitride. In some embodiments, the capping layer 103 may be formed using a CVD process or any other suitable process.

Figure 8:
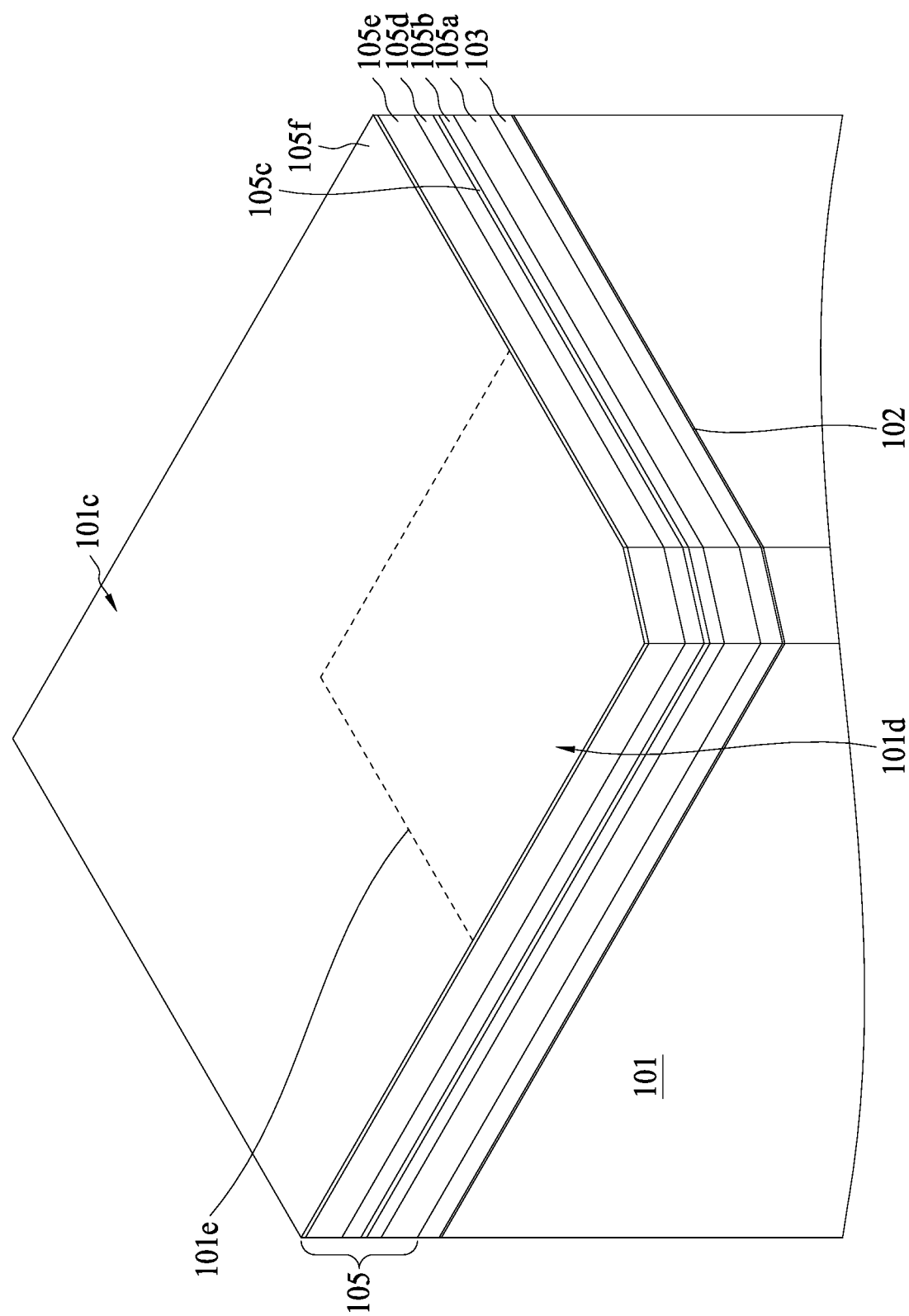

Referring to FIG. 8, a first hardmask stack 105 is disposed on the capping layer 103 according to step S204 in FIG. 6. In some embodiments, the first hardmask stack 105 includes several layers stacked over each other. In some embodiments, the first hardmask stack 105 includes a first layer 105a, a second layer 105b, a third layer 105c, a fourth layer 105d, a fifth layer 105e and a sixth layer 105f. In some embodiments, the first layer 105a, the second layer 105b, the third layer 105c, the fourth layer 105d, the fifth layer 105e and the sixth layer 105f are sequentially formed over the capping layer 103.

In some embodiments, the first layer 105a is disposed on the capping layer 103. In some embodiments, the first layer 105a includes carbon. In some embodiments, the first layer 105a is formed by a CVD process or any other suitable process. In some embodiments, the second layer 105b is disposed over the first layer 105a. In some embodiments, the second layer 105b includes nitride. In some embodiments, the second layer 105b is formed by a CVD process or any other suitable process. In some embodiments, the first layer 105a and the second layer 105b have different compositions from each other to enable selective etching of each relative to the other.

In some embodiments, the third layer 105c is disposed on the second layer 105b. In some embodiments, the third layer 105c includes polysilicon. In some embodiments, the third layer 105c is formed by a CVD process or any other suitable process. In some embodiments, the fourth layer 105d is disposed on the third layer 105c. In some embodiments, the fourth layer 105d includes oxide, e.g., silicon oxide. In some embodiments, the fourth layer 105d is formed by a CVD process or any other suitable process. In some embodiments, the deposition of the third layer 105c and the fourth layer 105d may be performed in-situ to save processing time and reduce possibility of contamination. As used herein, the term "in-situ" is used to refer to processes in which the substrate 101 being processed is not exposed to an external ambient (e.g., external to the processing system) environment.

In some embodiments, the fifth layer 105e is disposed on the fourth layer 105d. In some embodiments, the fifth layer 105e includes carbon. In some embodiments, the fifth layer 105e is a sacrificial layer. In some embodiments, the fifth layer 105e may be formed using a CVD process or any other suitable process. In some embodiments, after the deposition of the fifth layer 105e, a polish process may be performed to obtain a flat surface.

In some embodiments, the sixth layer 105f is disposed on the fifth layer 105e. In some embodiments, the sixth layer 105f includes dielectric material such as nitride or oxynitride. In some embodiments, the sixth layer 105f is an antireflective coating (ARC) layer. In some embodiments, the sixth layer 105f may be formed by a plasma-enhanced CVD (PECVD) process.

Figure 9:
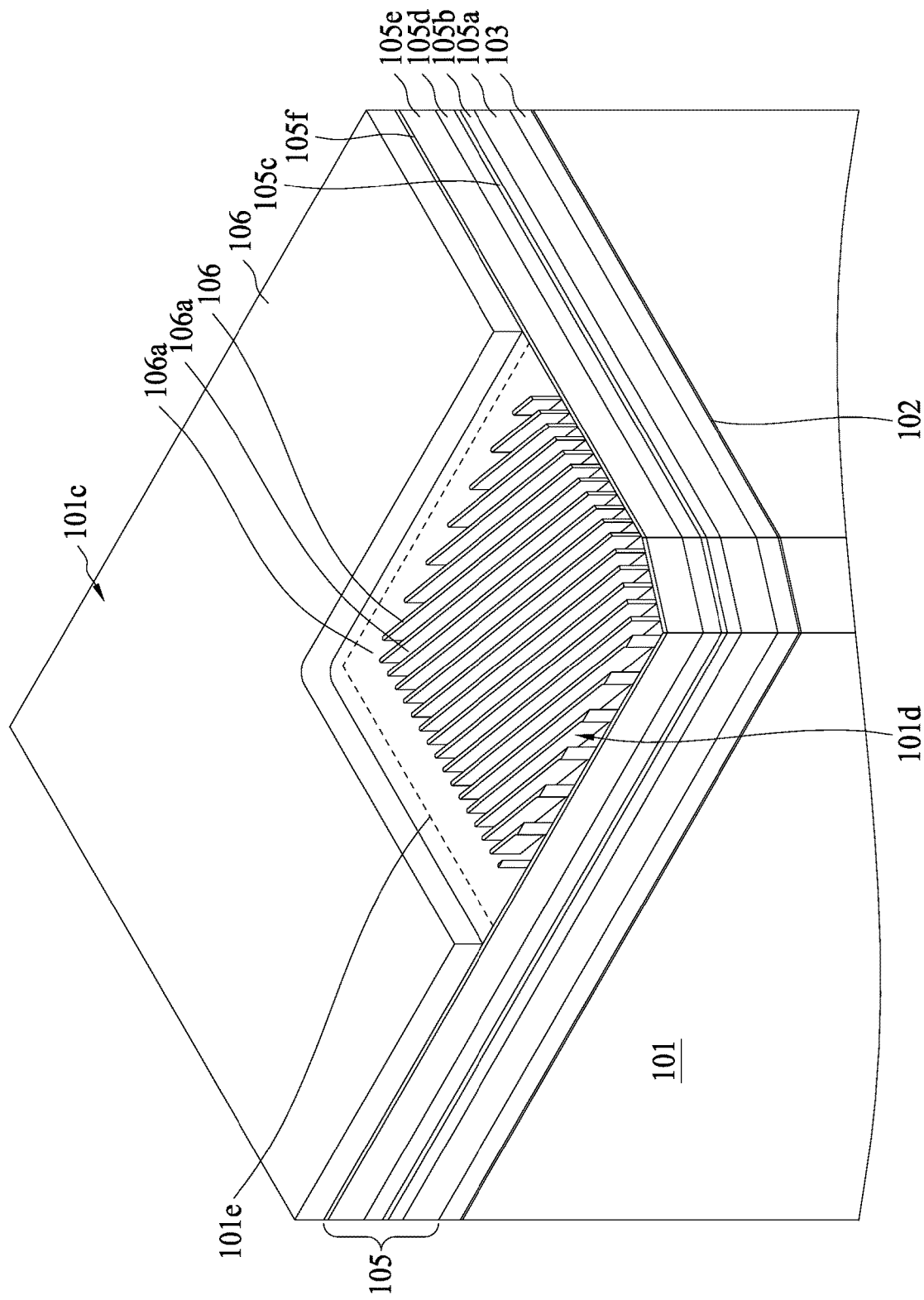

Referring to FIG. 9, the first hardmask stack 105 is patterned according to step S205 in FIG. 6. In some embodiments, the patterning of the first hardmask stack 105 includes disposing a first photoresist 106 over the first hardmask stack 105, and removing portions of the first hardmask stack 105 exposed through the first photoresist 106. In some embodiments, the first photoresist 106 is patterned after the disposing of the first photoresist 106 and before the removal of portions of the first hardmask stack 105. In some embodiments, the first photoresist 106 is patterned by photolithography, etching or any other suitable process.

In some embodiments, the first photoresist 106 includes several slots 106a over the first hardmask stack 105. In some embodiments, portions of the sixth layer 105f are exposed through the first photoresist 106. In some embodiments, the sixth layer 105f is formed between the fifth layer 105e and the first photoresist 106 in order to eliminate problems associated with reflection of light when exposing the first photoresist 106. In some embodiments, the sixth layer 105f may stabilize an etching selectivity of the fifth layer 105e.

Figure 10:
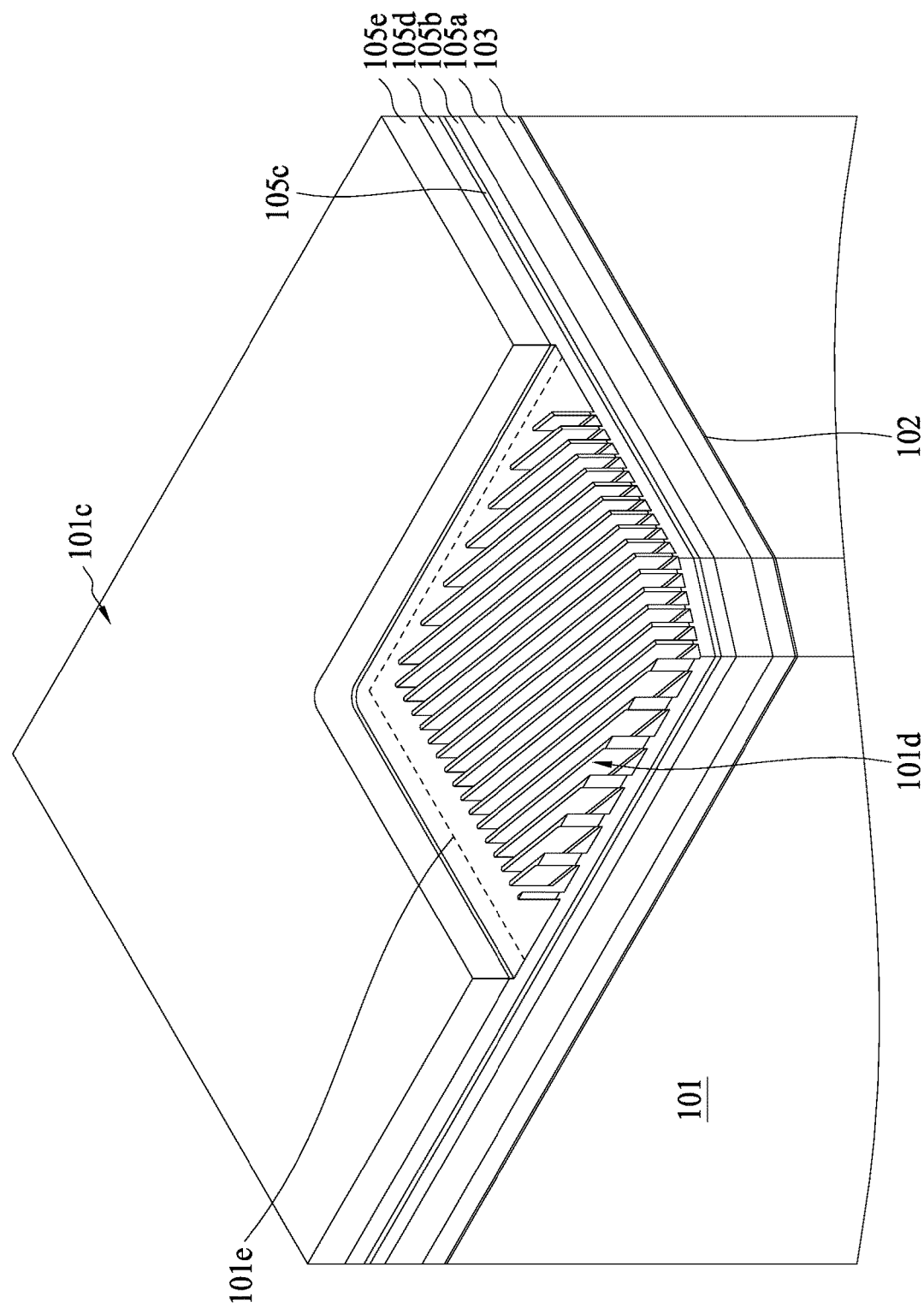

Referring to FIG. 10, portions of the fourth layer 105d, the fifth layer 105e and the sixth layer 105f exposed through the first photoresist 106 are removed. In some embodiments, after the removal of the portions of the fourth layer 105d, the fifth layer 105e and the sixth layer 105f exposed through the first photoresist 106, the first photoresist 106 and the remaining portion of the sixth layer 105f are removed.

Figure 11:
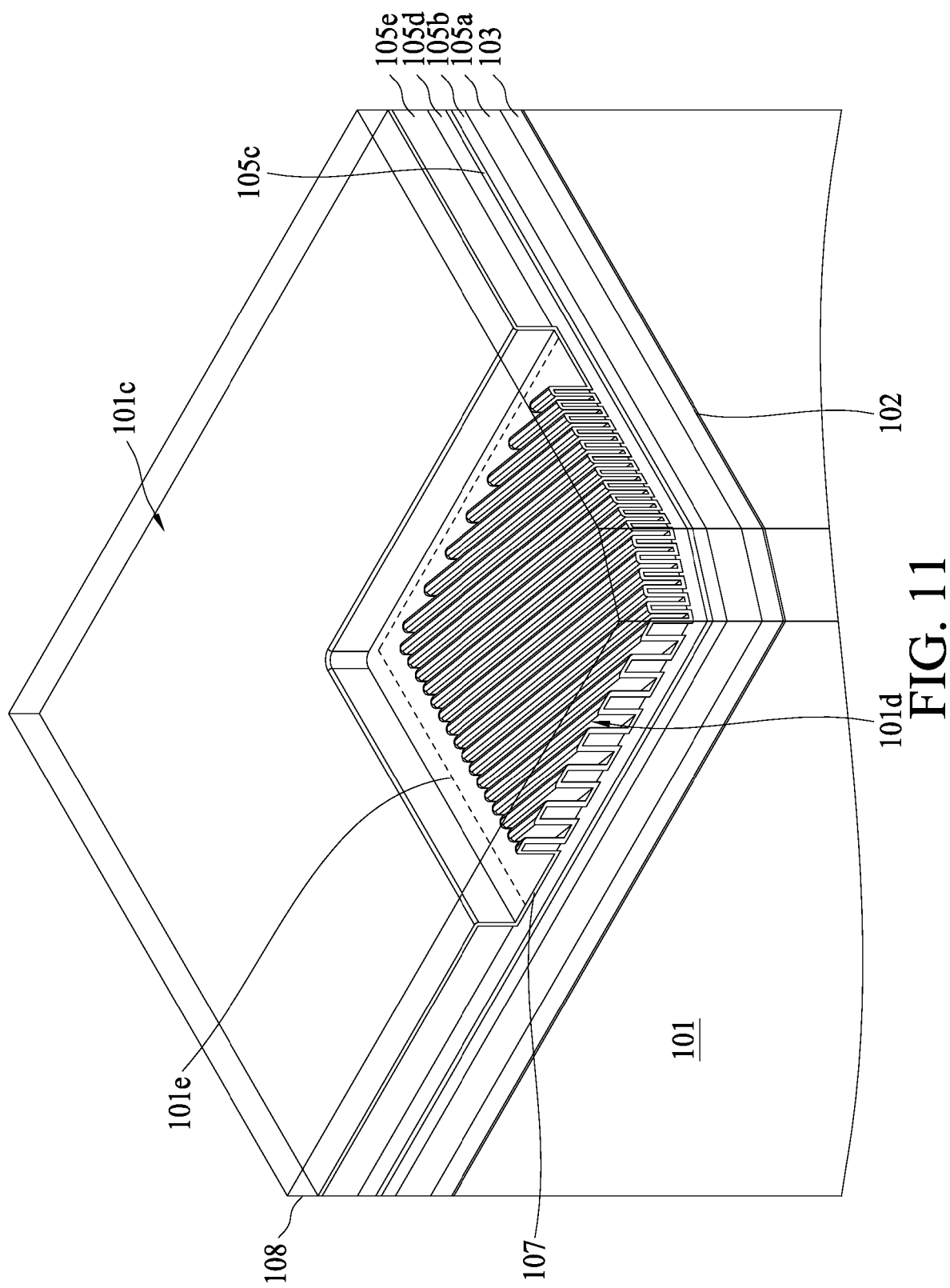

Referring to FIG. 11, an oxide layer 107 is disposed conformal to the fifth layer 105e. In some embodiments, a coating 108 is disposed over the oxide layer 107. In some embodiments, the coating 108 is an antireflective coating (ARC).

Figure 12:
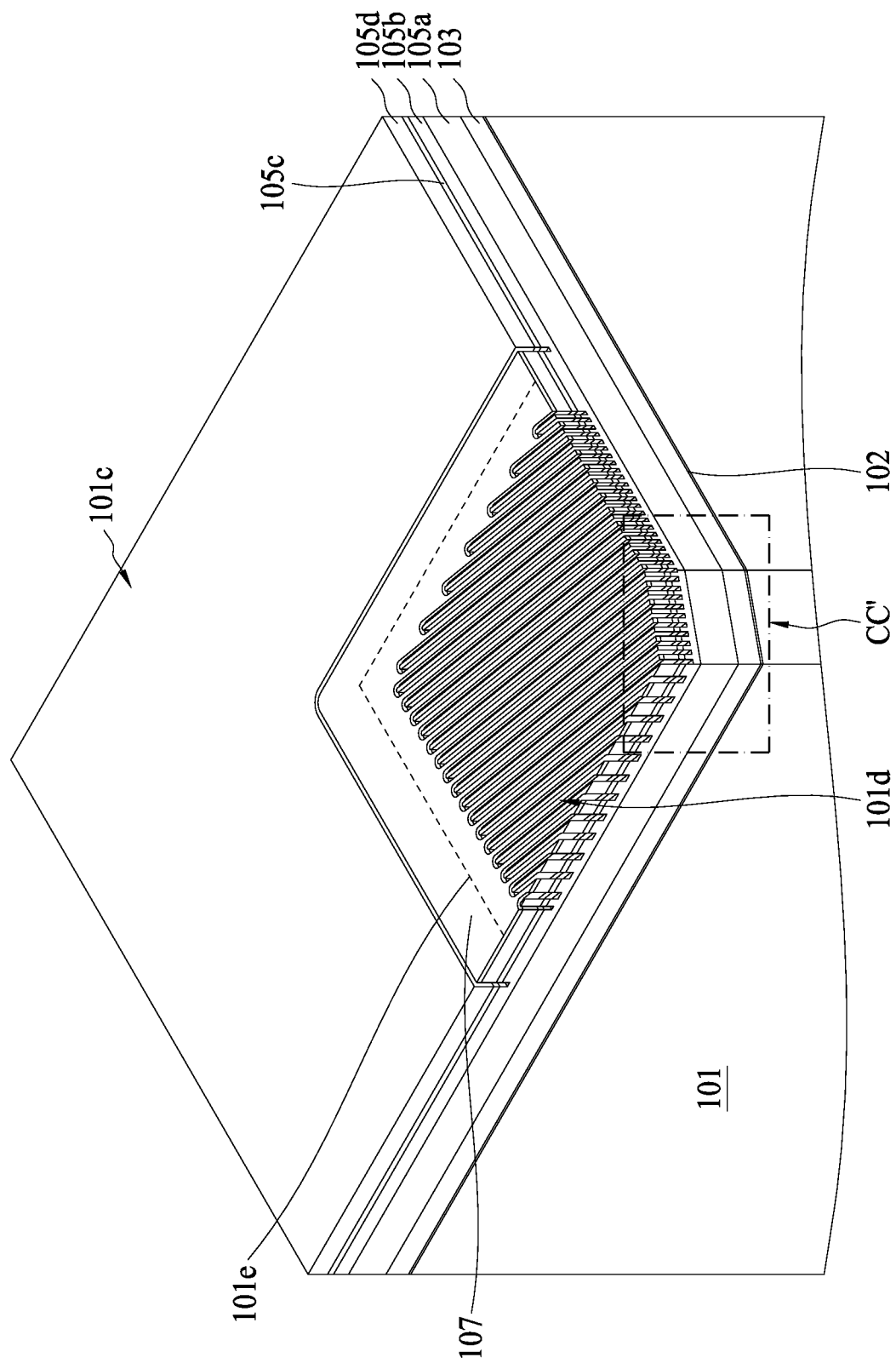
Figure 13:
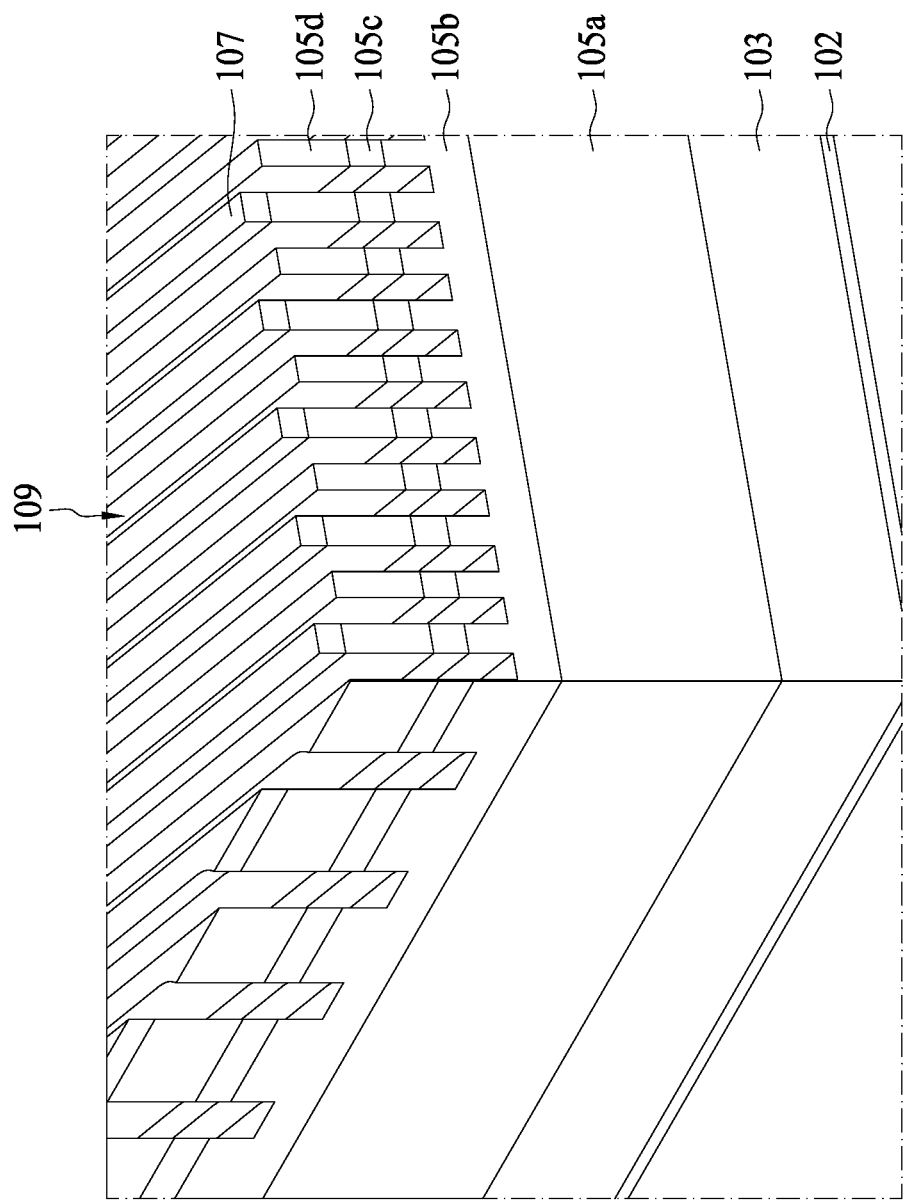

Referring to FIG. 12 and FIG. 13 showing an enlarged view of a portion CC' in FIG. 12, portions of the oxide layer 107 and portions of the fifth layer 105e are sequentially removed. In some embodiments, the portions of the oxide layer 107 are removed by dry etching or any other suitable process. In some embodiments, some portions of the oxide layer 107 are left remaining on the fourth layer 105d. As a result, a top surface of the oxide layer 107 is substantially coplanar with a top surface of the fourth layer 105d. In some embodiments, portions of the fourth layer 105d, portions of the third layer 105c and portions of the second layer 105b in the array area 101d are sequentially removed. As such, several strips 109 protruding from the second layer 105b are formed in the array area 101d.

Figure 14:
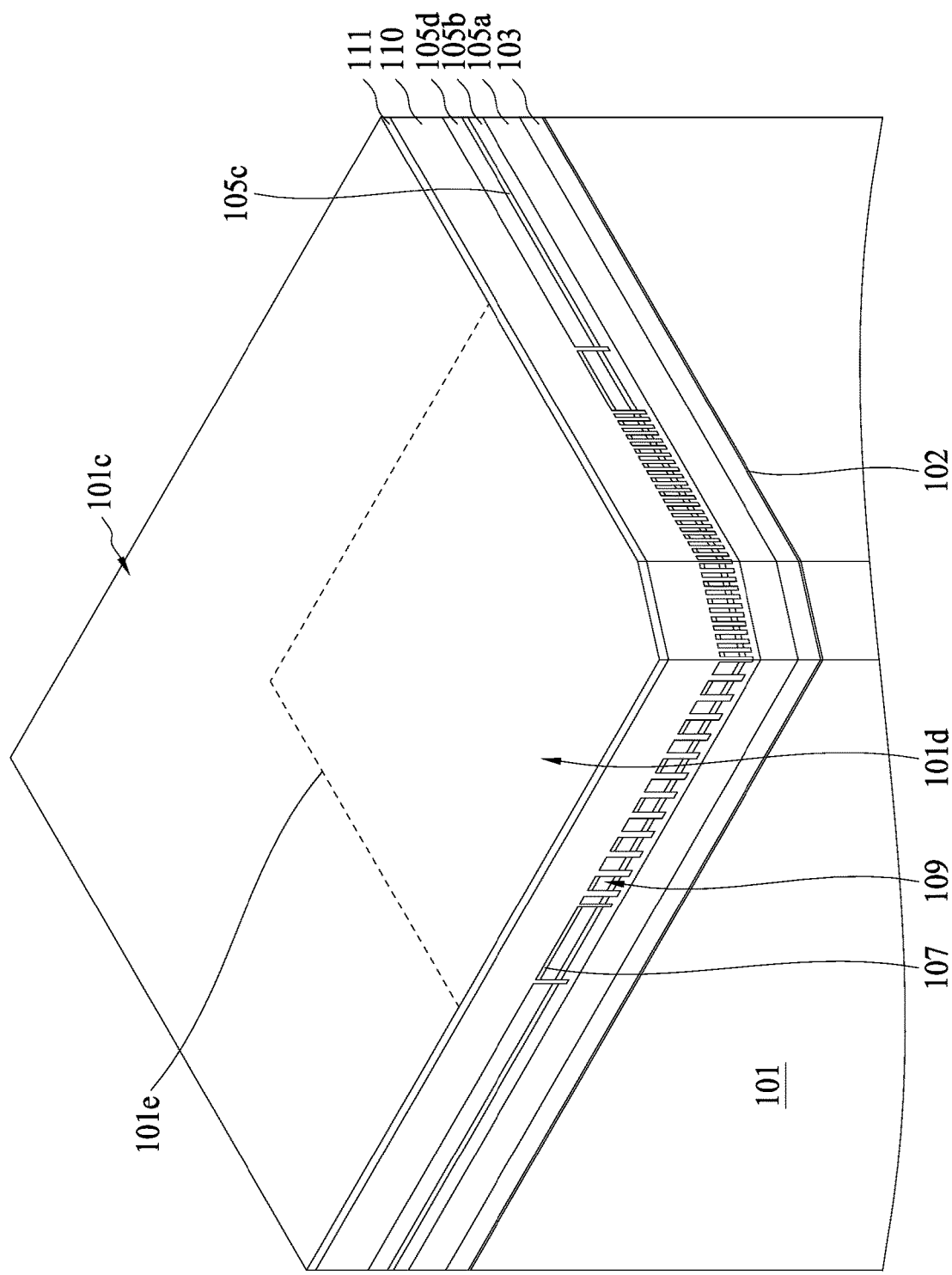

Referring to FIG. 14, a seventh layer 110 is disposed over the fourth layer 105d and the oxide layer 107, and an eighth layer 111 is then disposed over the seventh layer 110. In some embodiments, the seventh layer 110 fills gaps between the strips 109. In some embodiments, the seventh layer 110 includes carbon. In some embodiments, the seventh layer 110 is a sacrificial layer. In some embodiments, the seventh layer 110 may be formed using a CVD process or any other suitable process. In some embodiments, after the deposition of the seventh layer 110, a polish process may be performed to obtain a flat surface.

In some embodiments, the eighth layer 111 is disposed on the seventh layer 110. In some embodiments, the eighth layer 111 includes dielectric material such as nitride or oxynitride. In some embodiments, the eighth layer 111 is an antireflective coating (ARC) layer. In some embodiments, the eighth layer 111 may be formed by a plasma-enhanced CVD (PECVD) process.

Figure 15:
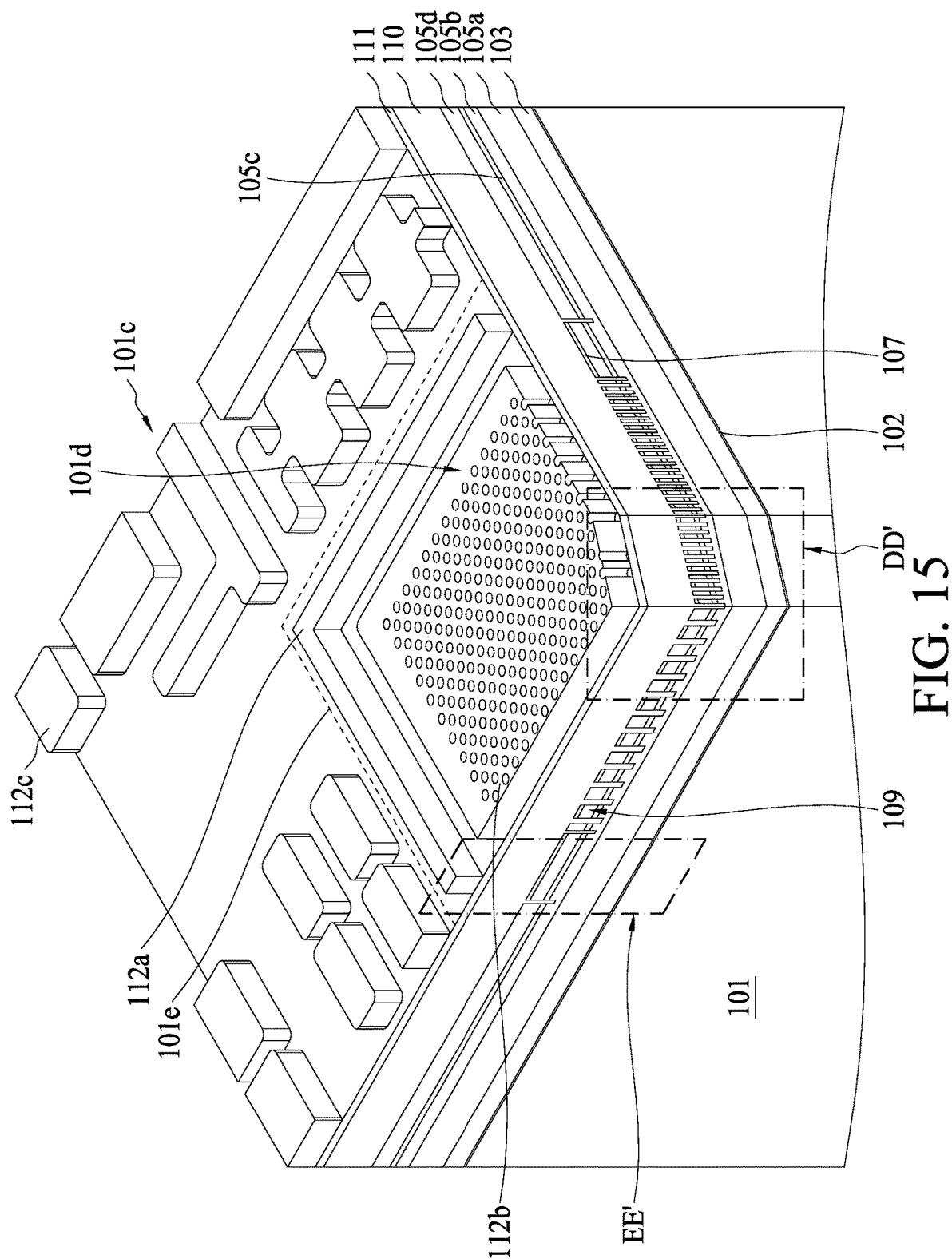

Referring to FIG. 15, a second photoresist 112 is disposed over the eighth layer 111. In some embodiments, the second photoresist 112 includes a first portion 112a, a second portion 112b and several third portions 112c. In some embodiments, the second photoresist 112 is patterned by removing portions of the second photoresist 112 to form the first portion 112a, the second portion 112b and the third portions 112c. In some embodiments, the second photoresist 112 is patterned by photolithography, etching or any other suitable process. In some embodiments, the first portion 112a is disposed within the array area 101d. In some embodiments, the second portion 112b is disposed within the array area 101d and extends along the boundary 101e. In some embodiments, the third portions 112c are disposed within the peripheral region 101c.

After the disposing of the second photoresist 112 over the eighth layer 111, several removal steps are performed. FIGS. 16 to 22 are enlarged views of a portion DD' in FIG. 15 and illustrate the removal steps performed at the portion DD', and FIGS. 23 to 28 are enlarged views of a portion EE' in FIG. 15 and illustrate the removal steps performed at the portion EE'.

Figure 16:
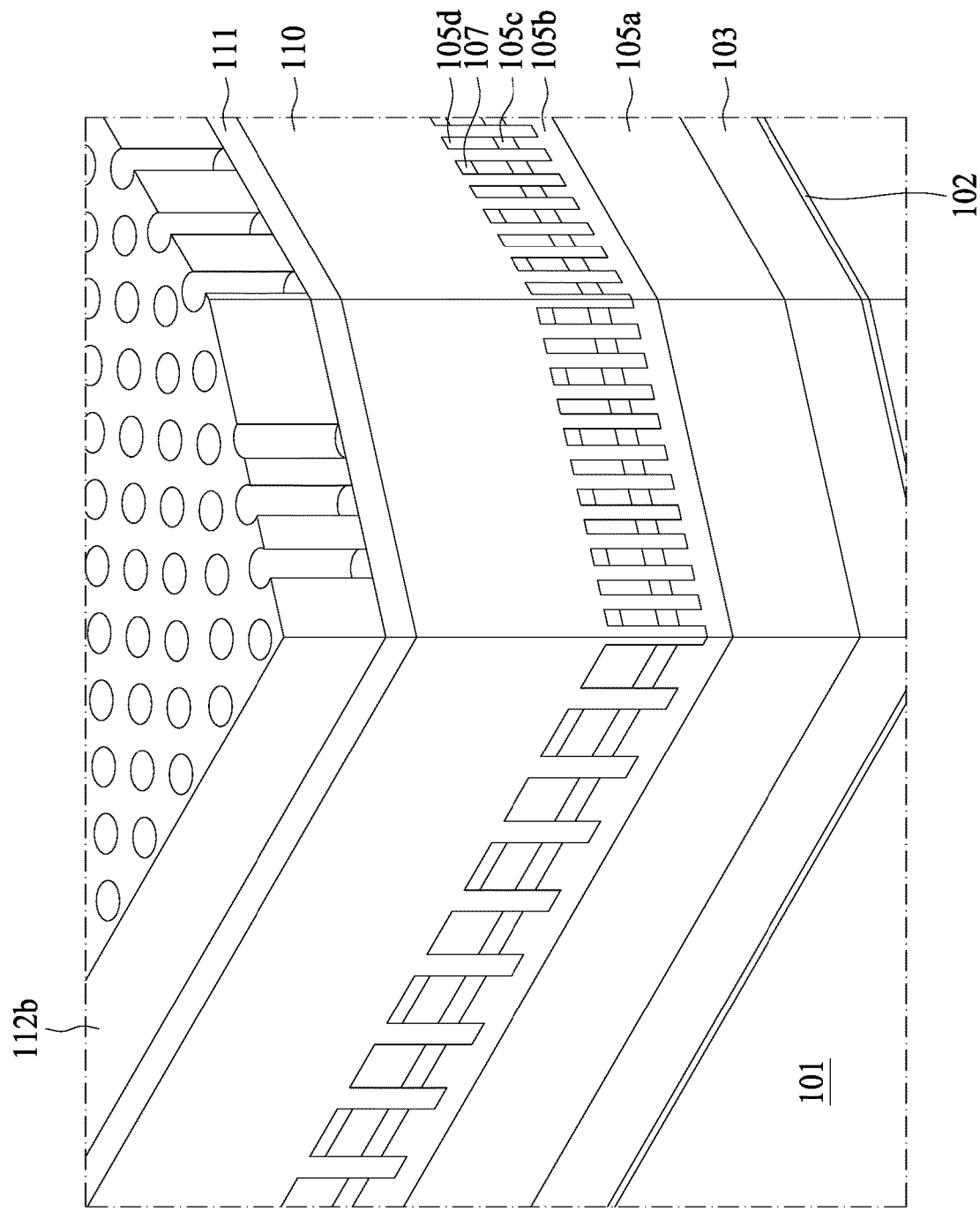
Figure 17:
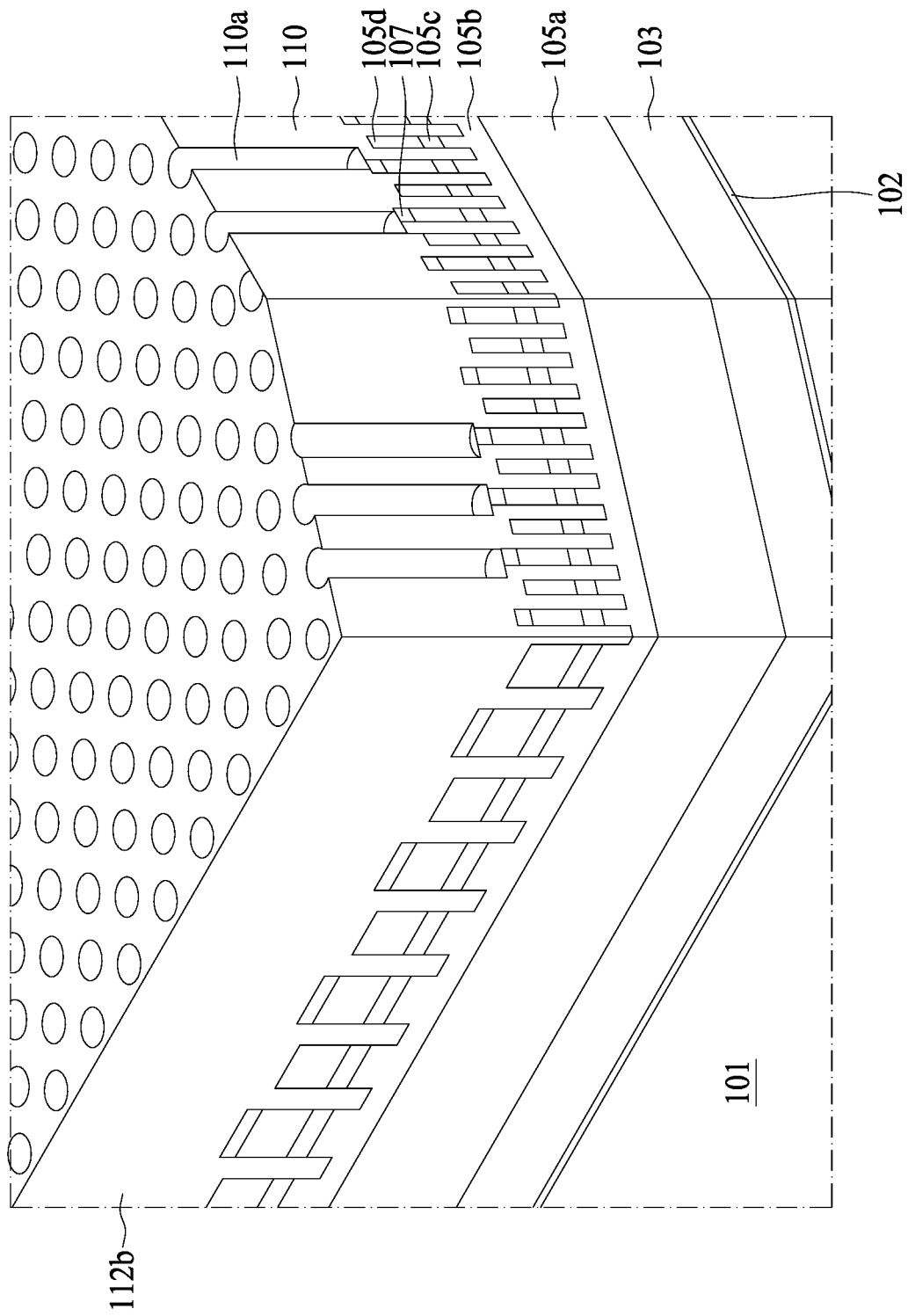

Referring to FIG. 16, the second portion 112b of the second photoresist 112 covers the eighth layer 111. Referring to FIG. 17, portions of the eighth layer 111 and portions of the seventh layer 110 exposed through the second portion 112b of the second photoresist 112 are removed. In some embodiments, several openings 110a are formed. In some embodiments, the remaining portion of the eighth layer 111 is removed after the formation of the openings 110a.

In some embodiments, the eighth layer 111 is removed by dry etching or any other suitable process. In some embodiments, the second photoresist 112 is removed by an ashing process, a wet strip process or any other suitable process. In some embodiments, the second photoresist 112 may be chemically altered so that it no longer adheres to the remaining portion of the eighth layer 111. In some embodiments, the remaining portion of the eighth layer 111 is then removed to expose the remaining portion of the seventh layer 110.

Figure 18:
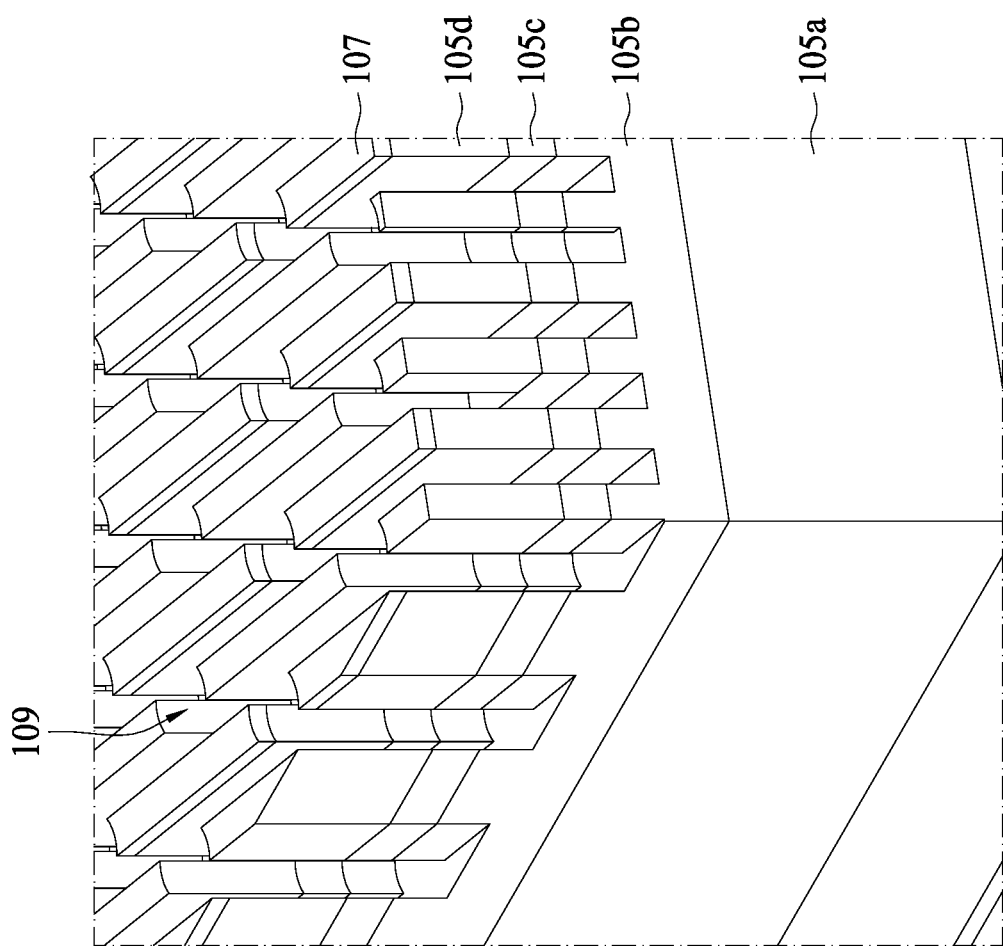
Figure 19:
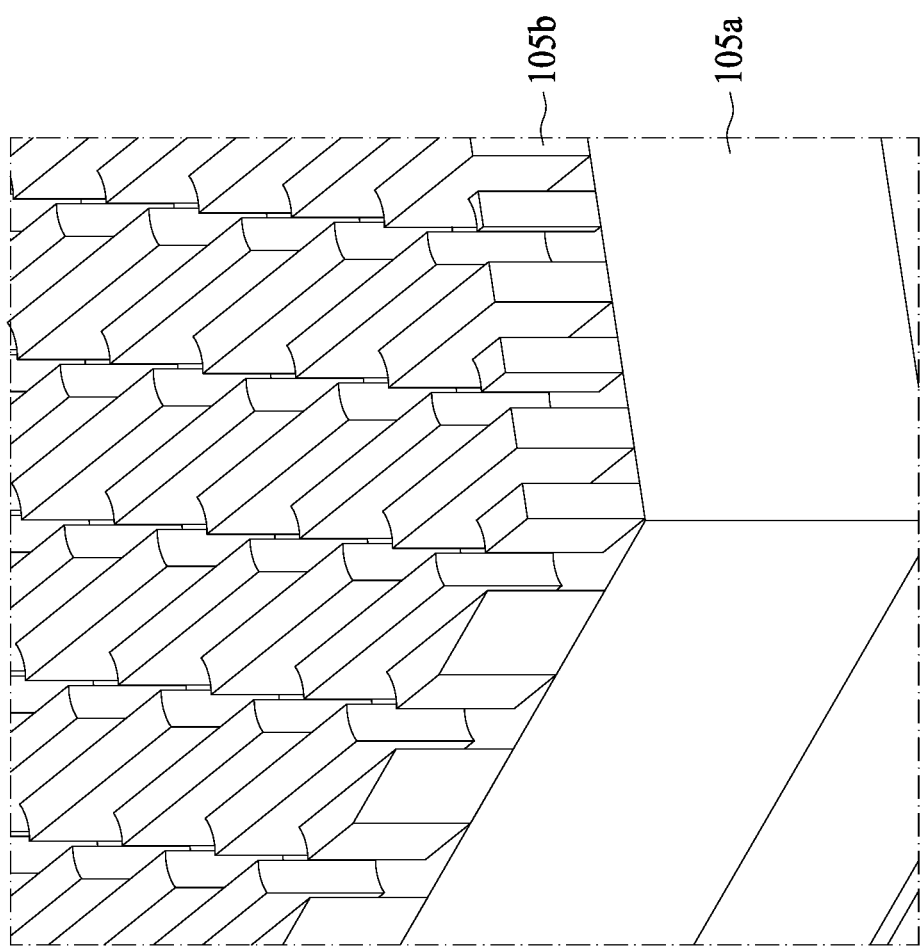

Referring to FIG. 18, the remaining portion of the seventh layer 110 is removed and the strips 109 are exposed. In some embodiments, the remaining portion of the seventh layer 110 is removed by dry etching or any other suitable process. Referring to FIG. 19, portions of the second layer 105b are further removed. In some embodiments, the portions of the second layer 105b are removed by dry etching or any other suitable process. In some embodiments, several portions of the second layer 105b are left remaining and are isolated from each other. In some embodiments, after the further removal of the portions of the second layer 105b, the oxide layer 107, the fourth layer 105d and the third layer 105c are also removed.

Figure 20:
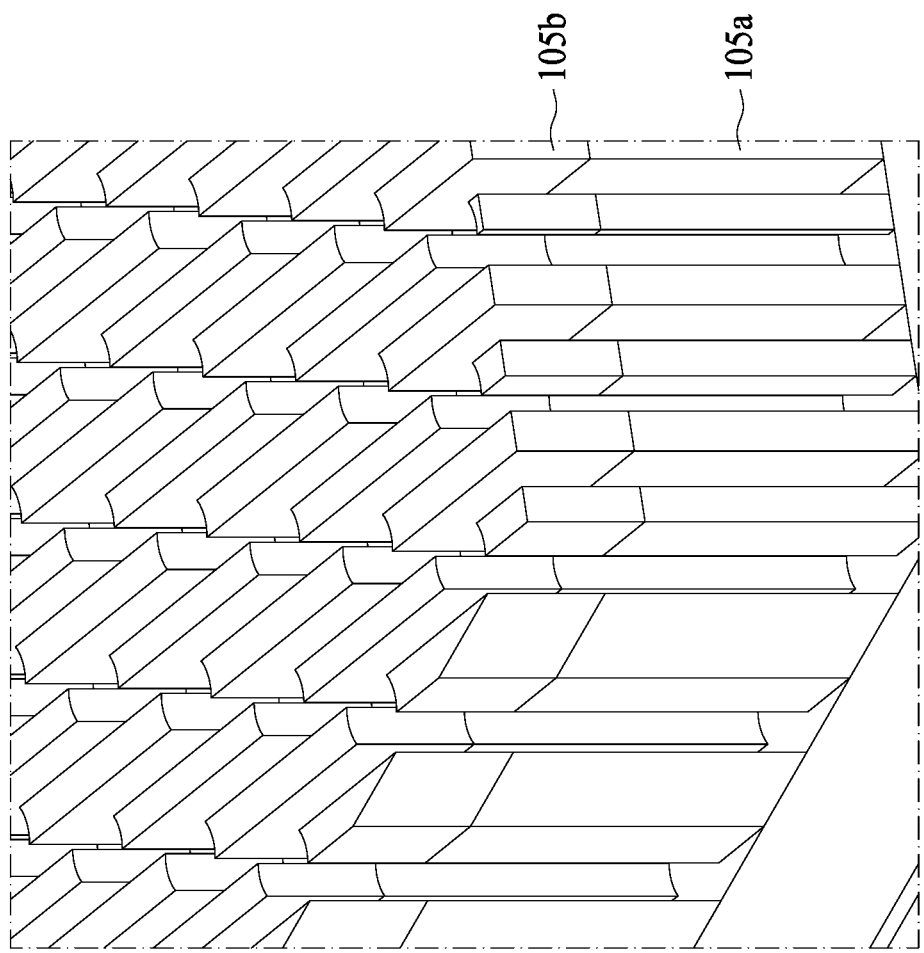

Referring to FIG. 20, portions of the first layer 105a exposed through the remaining portion of the second layer 105b are removed. In some embodiments, the portions of the first layer 105a are removed by dry etching or any other suitable process. In some embodiments, several portions of the first layer 105a are left remaining and are isolated from each other. In some embodiments, the remaining portions of the second layer 105b are removed after the removal of the portions of the first layer 105a.

Figure 21:
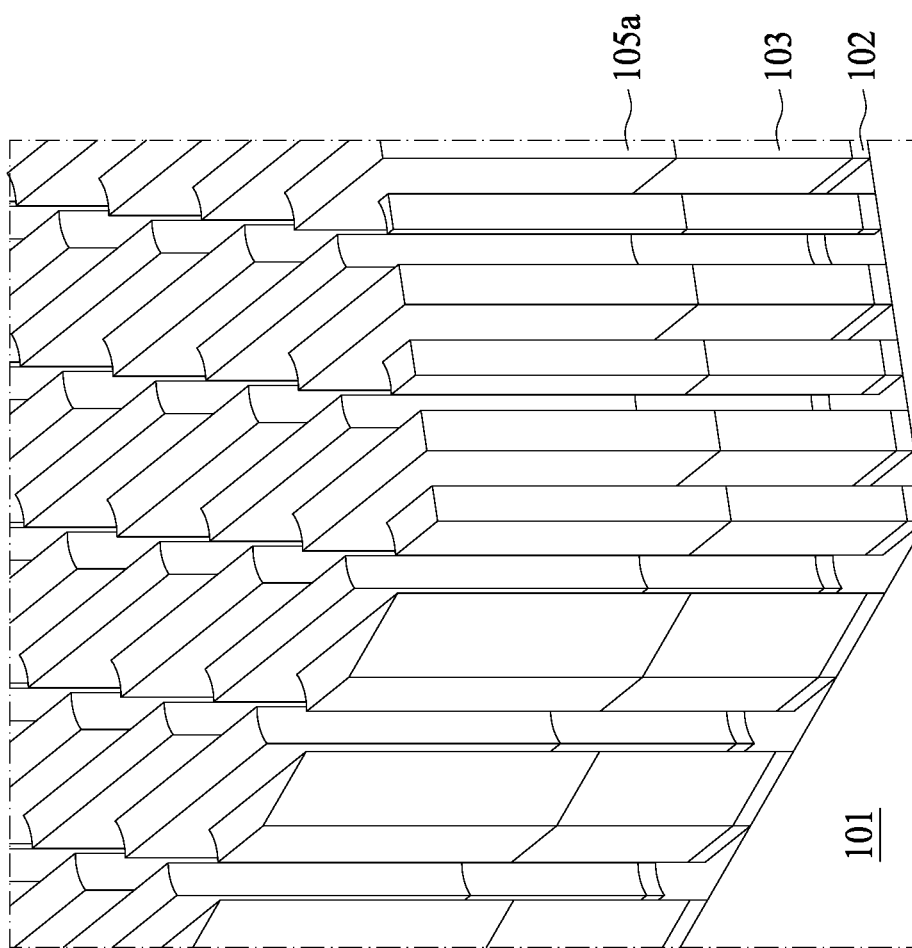

Referring to FIG. 21, portions of the capping layer 103 and portions of the insulating layer 102 exposed through the remaining portions of the first layer 105a are removed. In some embodiments, the portions of the capping layer 103 and the portions of the insulating layer 102 are removed simultaneously, sequentially or separately. In some embodiments, the portions of the capping layer 103 are removed, and then the portions of the insulating layer 102 are removed. In some embodiments, the portions of the capping layer 103 are removed by dry etching or any other suitable process. In some embodiments, the portions of the insulating layer 102 are removed by dry etching or any other suitable process.

Figure 22:
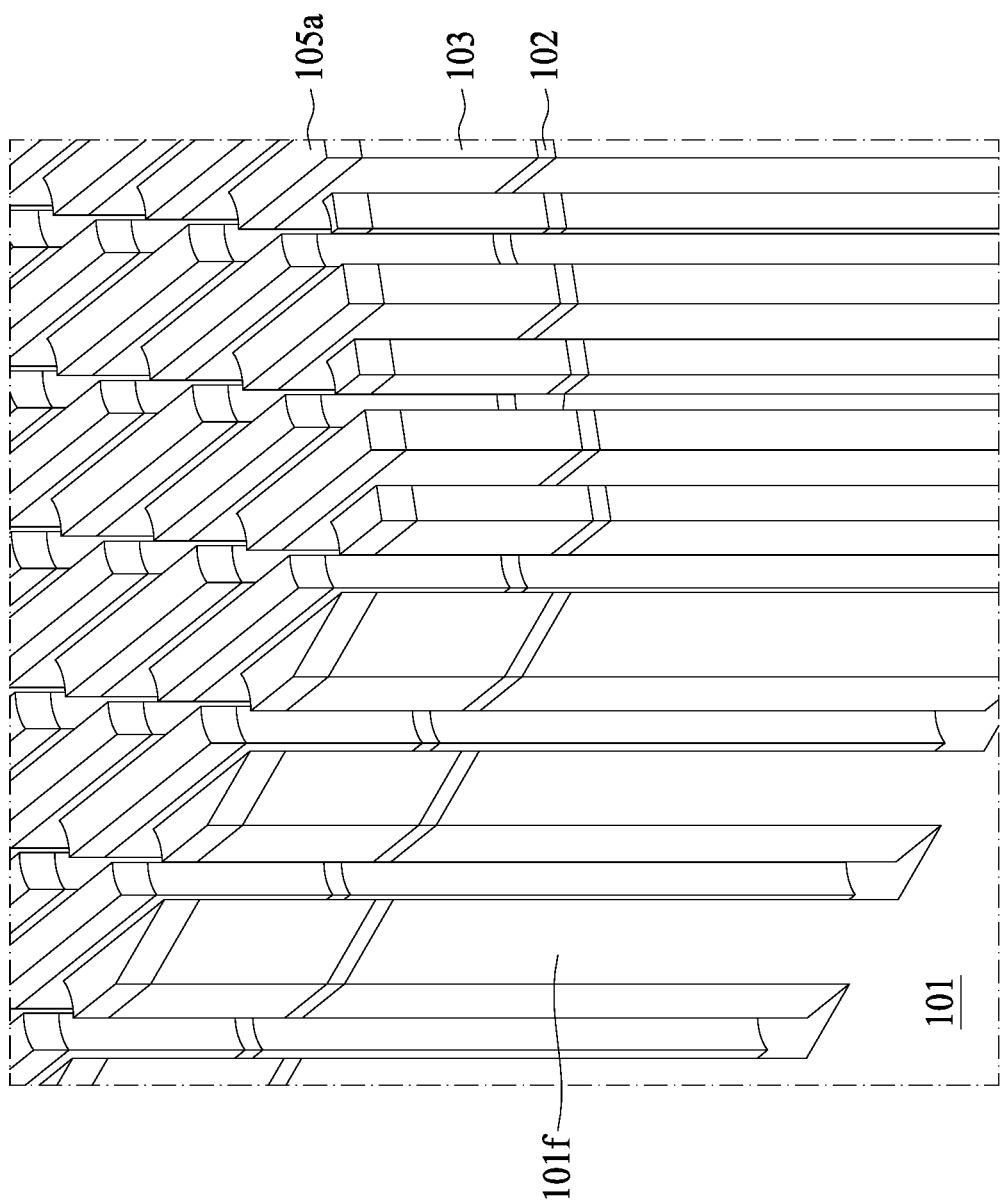

Referring to FIG. 22, portions of the substrate 101 exposed through the remaining portions of the insulating layer 102, the remaining portions of the capping layer 103 and the remaining portions of the first layer 105a are removed to form several fins 101f protruding from the substrate 101. In some embodiments, the portions of the substrate 101 are removed by dry etching or any other suitable process. In some embodiments, the fins 101f are separated from each other. In some embodiments, the fin 101f has a configuration similar to that of the fin 101f described above or illustrated in FIG. 1.

As mentioned above, after the disposing of the second photoresist 112 over the eighth layer 111 as shown in FIG. 15, several removal steps are performed. FIGS. 23 to 28 are enlarged views of the portion EE' in FIG. 15 and illustrate the removal steps performed at the portion EE'. In some embodiments, the removal steps performed at the portion EE' are similar to the removal steps performed at the portion DD' described above or illustrated in FIGS. 16 to 22.

Figure 23:
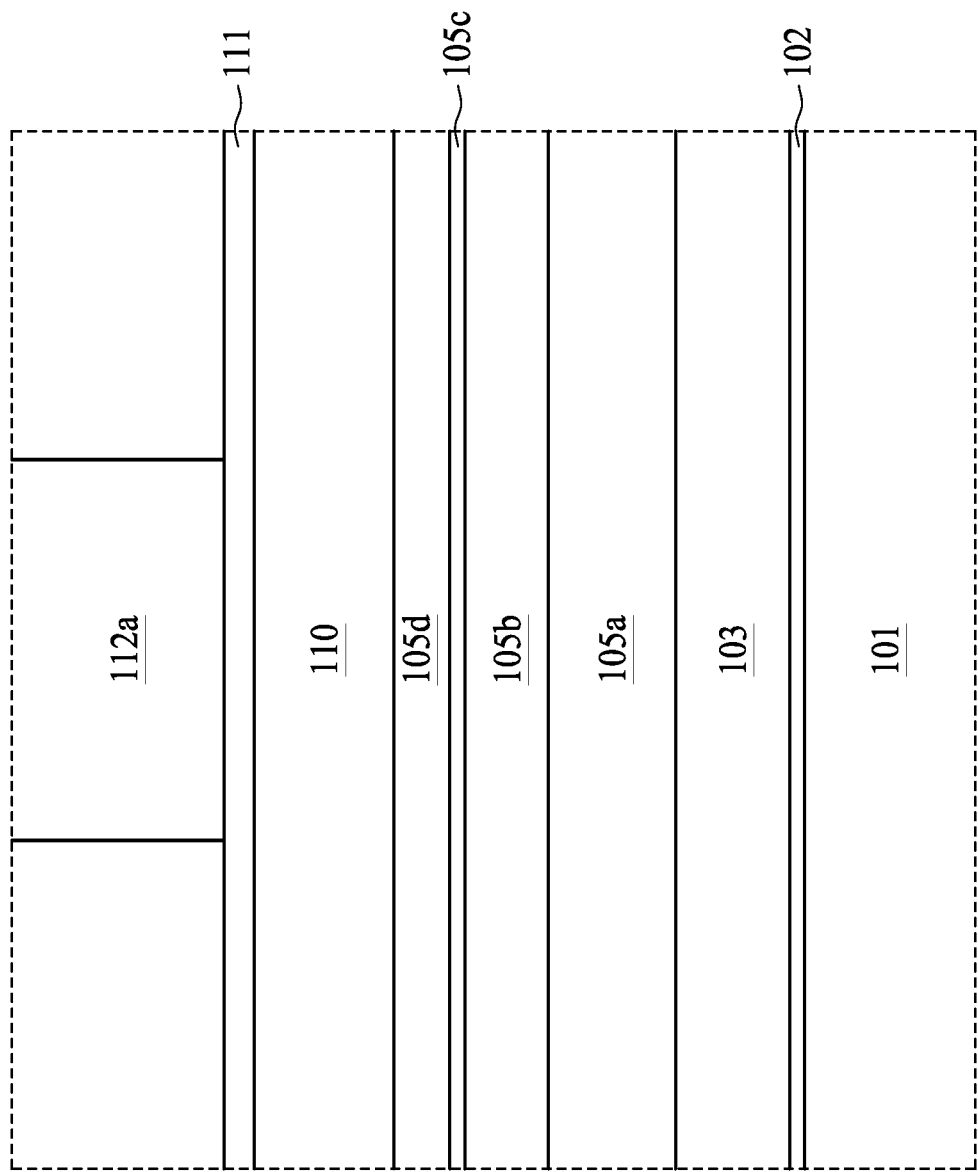
Figure 24:
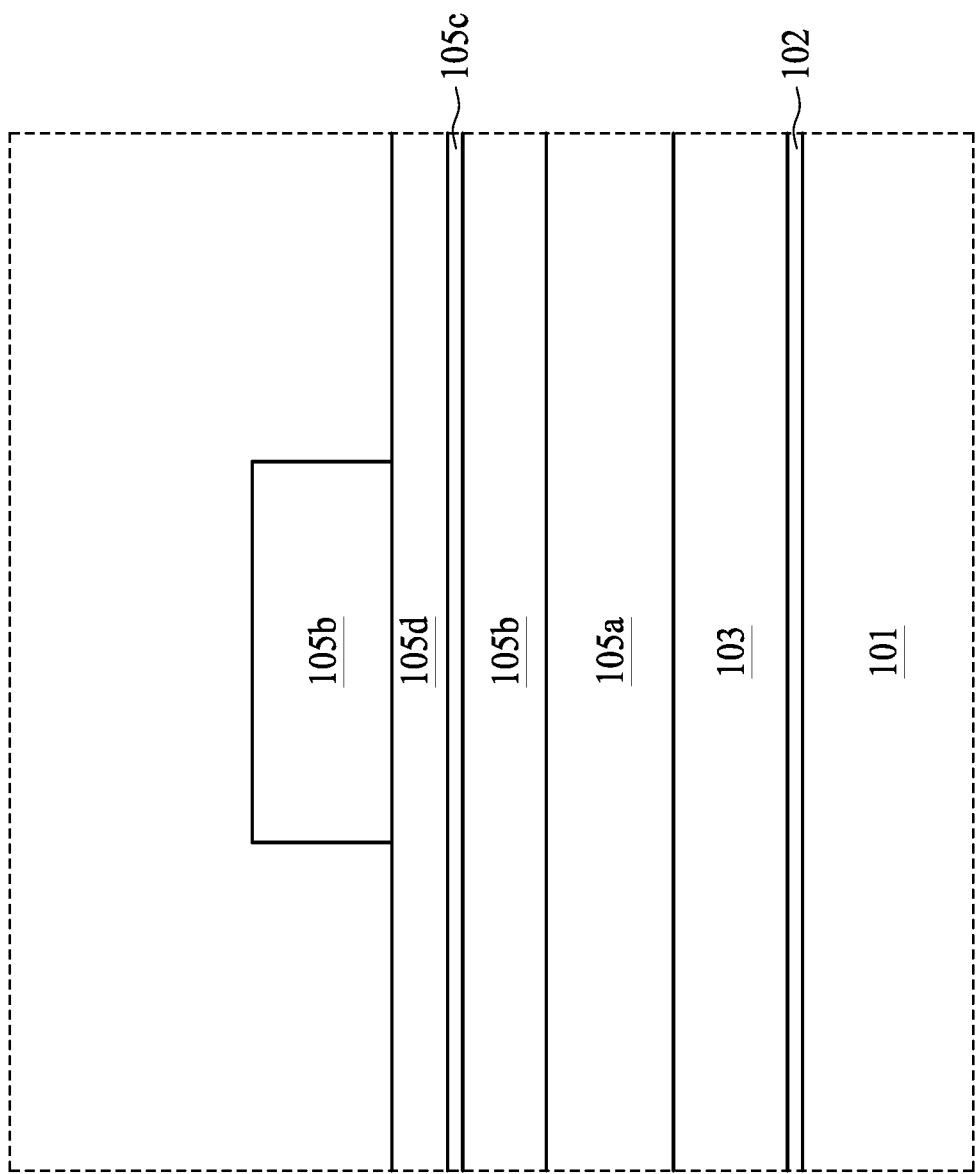

Referring to FIG. 23, the first portion 112a of the second photoresist 112 covers the eighth layer 111. Referring to FIG. 24, portions of the eighth layer 111 and portions of the seventh layer 110 exposed through the first portion 112a of the second photoresist 112 are removed. In some embodiments, the remaining portion of the eighth layer 111 is then removed. In some embodiments, the eighth layer 111 is removed by dry etching or any other suitable process. In some embodiments, the second photoresist 112 is removed by an ashing process, a wet strip process or any other suitable process. In some embodiments, the second photoresist 112 may be chemically altered so that it no longer adheres to the remaining portion of the eighth layer 111. In some embodiments, the remaining portion of the eighth layer 111 is then removed to expose the remaining portion of the seventh layer 110.

Figure 25:
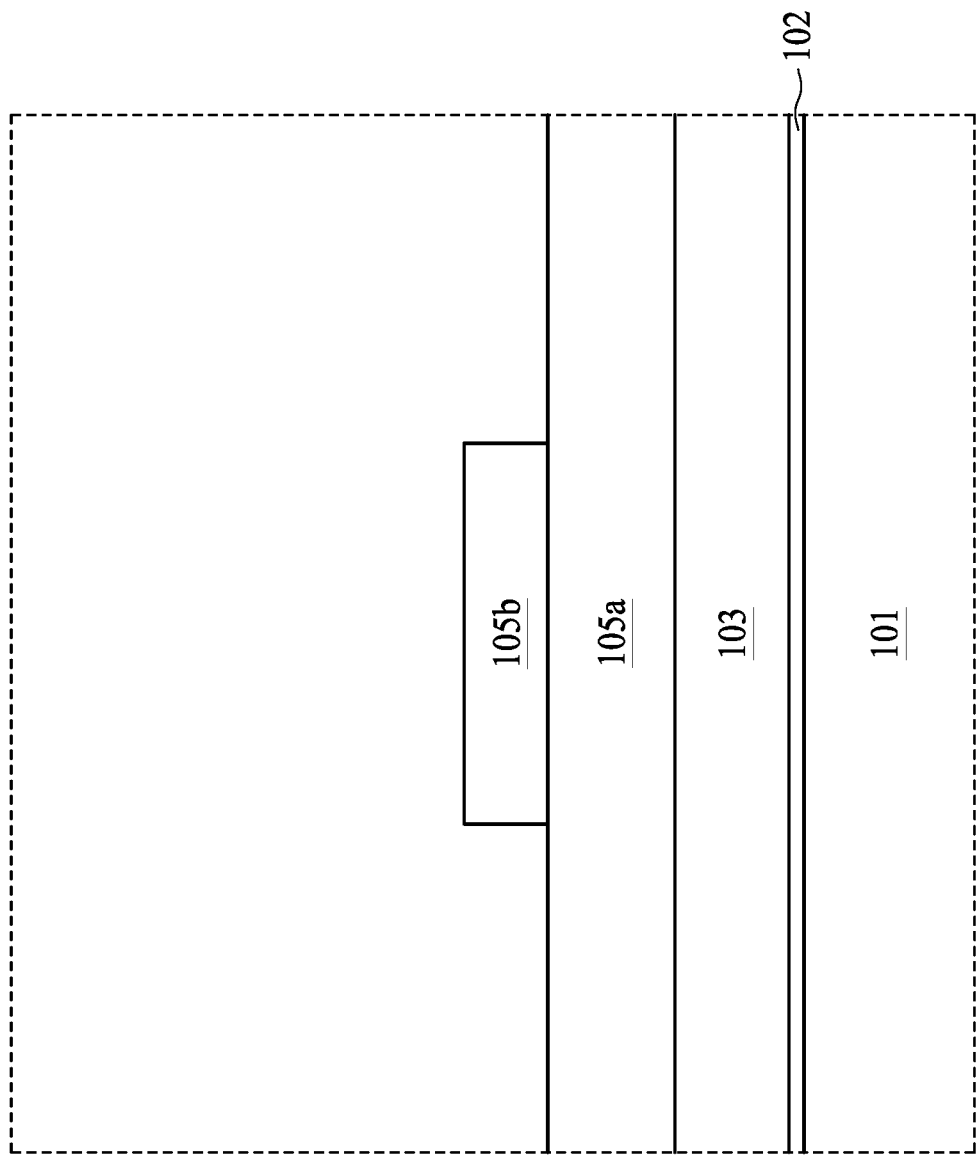

Referring to FIG. 25, portions of the fourth layer 105d, portions of the third layer 105c and portions of the second layer 105b exposed through the remaining portion of the seventh layer 110 are removed sequentially. In some embodiments, the remaining portion of the seventh layer 110 is removed by dry etching or any other suitable process.

Figure 26:
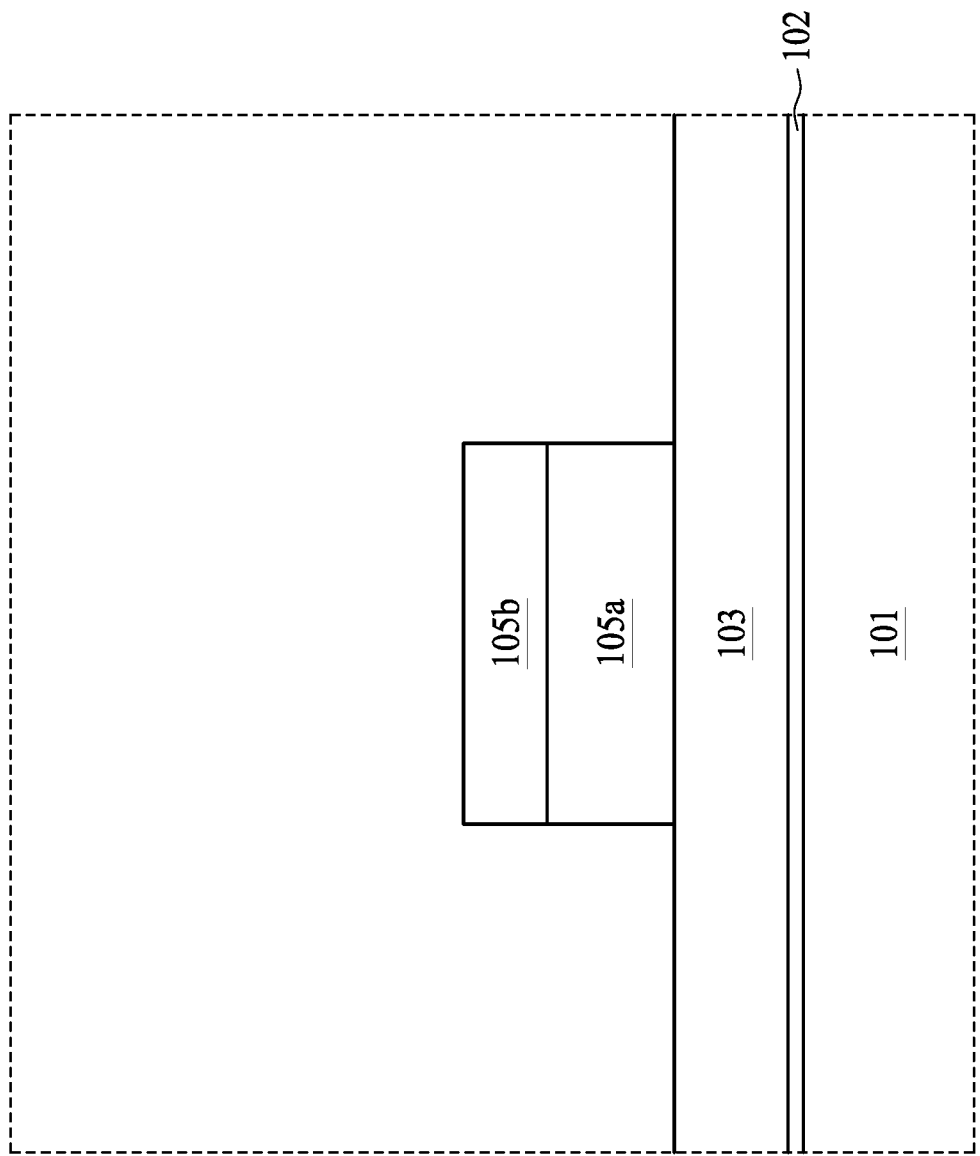

Referring to FIG. 26, portions of the first layer 105a exposed through the remaining portions of the second layer 105b are removed. In some embodiments, the portions of the first layer 105a are removed by dry etching or any other suitable process. In some embodiments, the remaining portion of the second layer 105b is then removed after the removal of portions of the first layer 105a.

Figure 27:
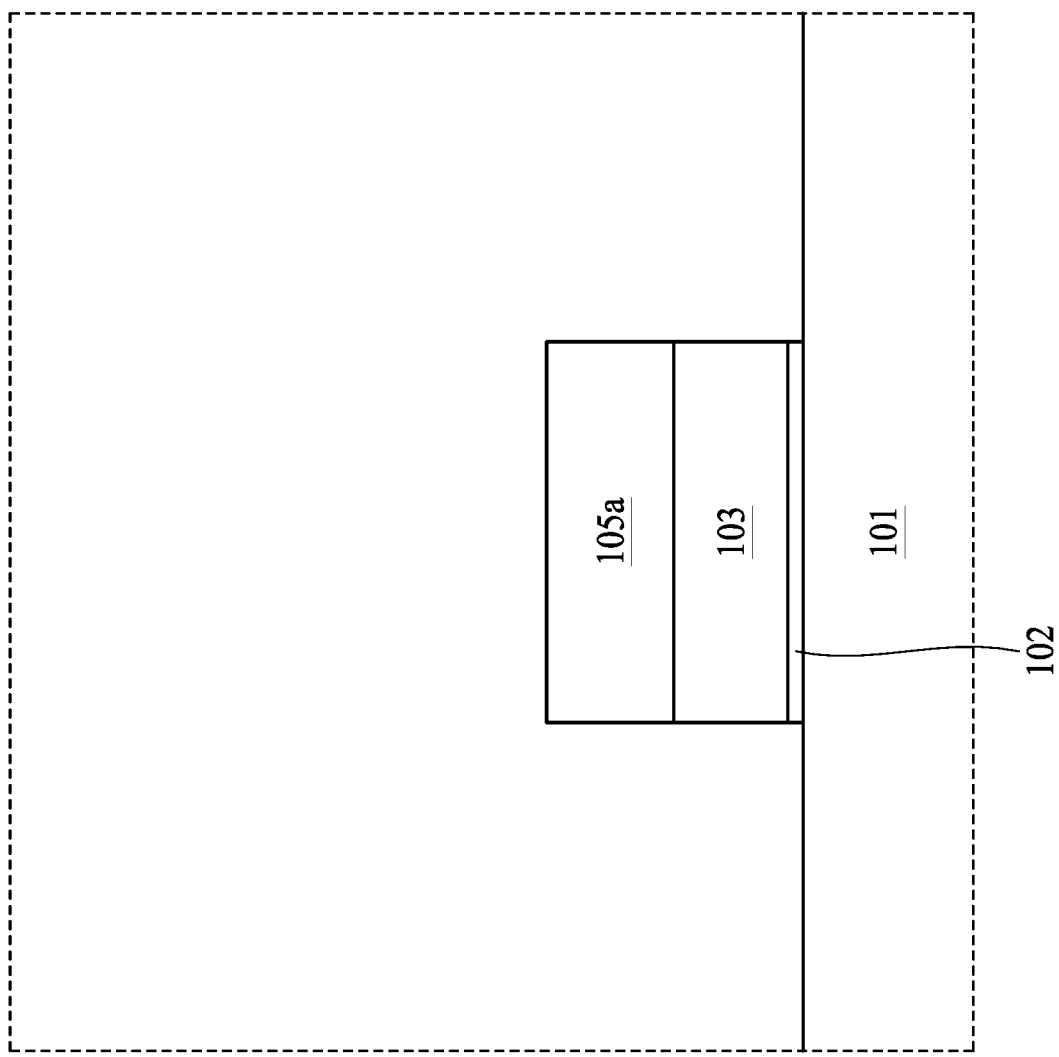

Referring to FIG. 27, portions of the capping layer 103 exposed through the remaining portion of the first layer 105a are removed according to step S206 in FIG. 6. In some embodiments, the portions of the capping layer 103 are removed by dry etching or any other suitable process. In some embodiments, portions of the insulating layer 102 exposed through the remaining portion of the first layer 105a are removed according to step S207 in FIG. 6. In some embodiments, the portions of the insulating layer 102 are removed by dry etching or any other suitable process. In some embodiments, the portions of the capping layer 103 and the portions of the insulating layer 102 are removed simultaneously, sequentially or separately. In some embodiments, the portions of the capping layer 103 are removed, and then the portions of the insulating layer 102 are removed.

Figure 28:
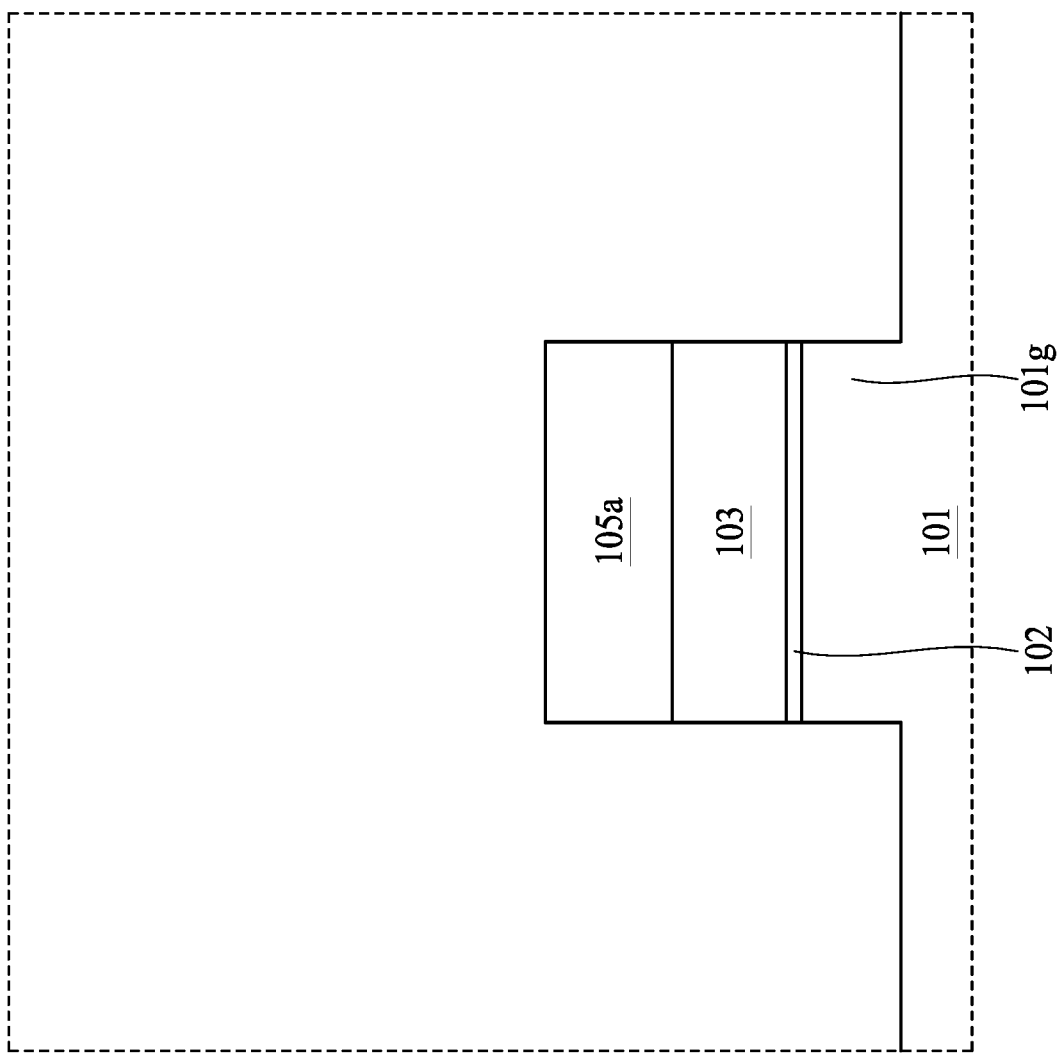

Referring to FIG. 28, portions of the substrate 101 exposed through the remaining portion of the insulating layer 102, the remaining portion of the capping layer 103 and the remaining portion of the first layer 105a are removed to form a first elongated member 101g protruding from the substrate 101 according to step S208 in FIG. 6. In some embodiments, the portions of the substrate 101 are removed by dry etching or any other suitable process. In some embodiments, the first elongated member 101g is separated from the fins 101f. In some embodiments, the first elongated member 101g has a configuration similar to that of the first elongated member 101g described above or illustrated in FIG. 1.

Figure 29:
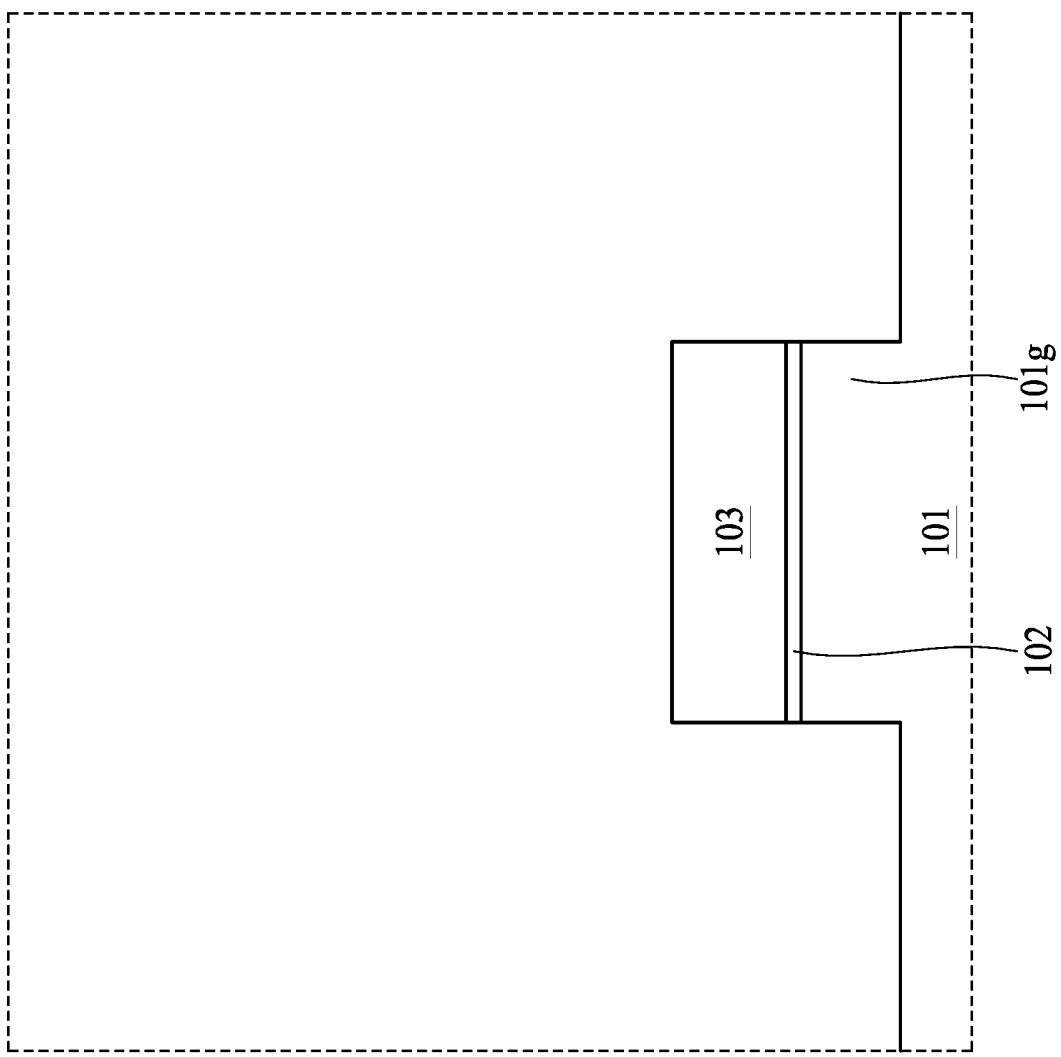
Figure 30:
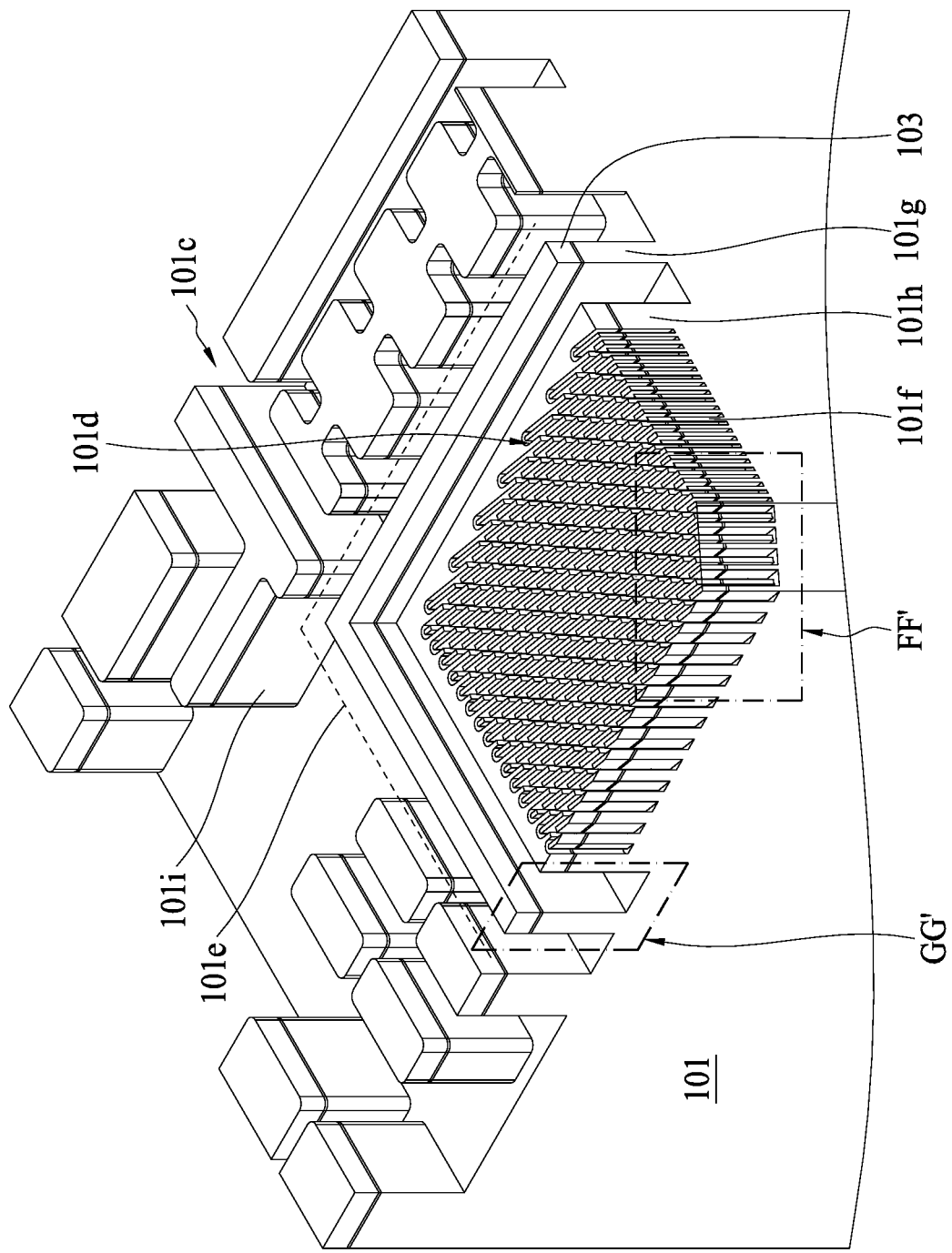
Figure 31:
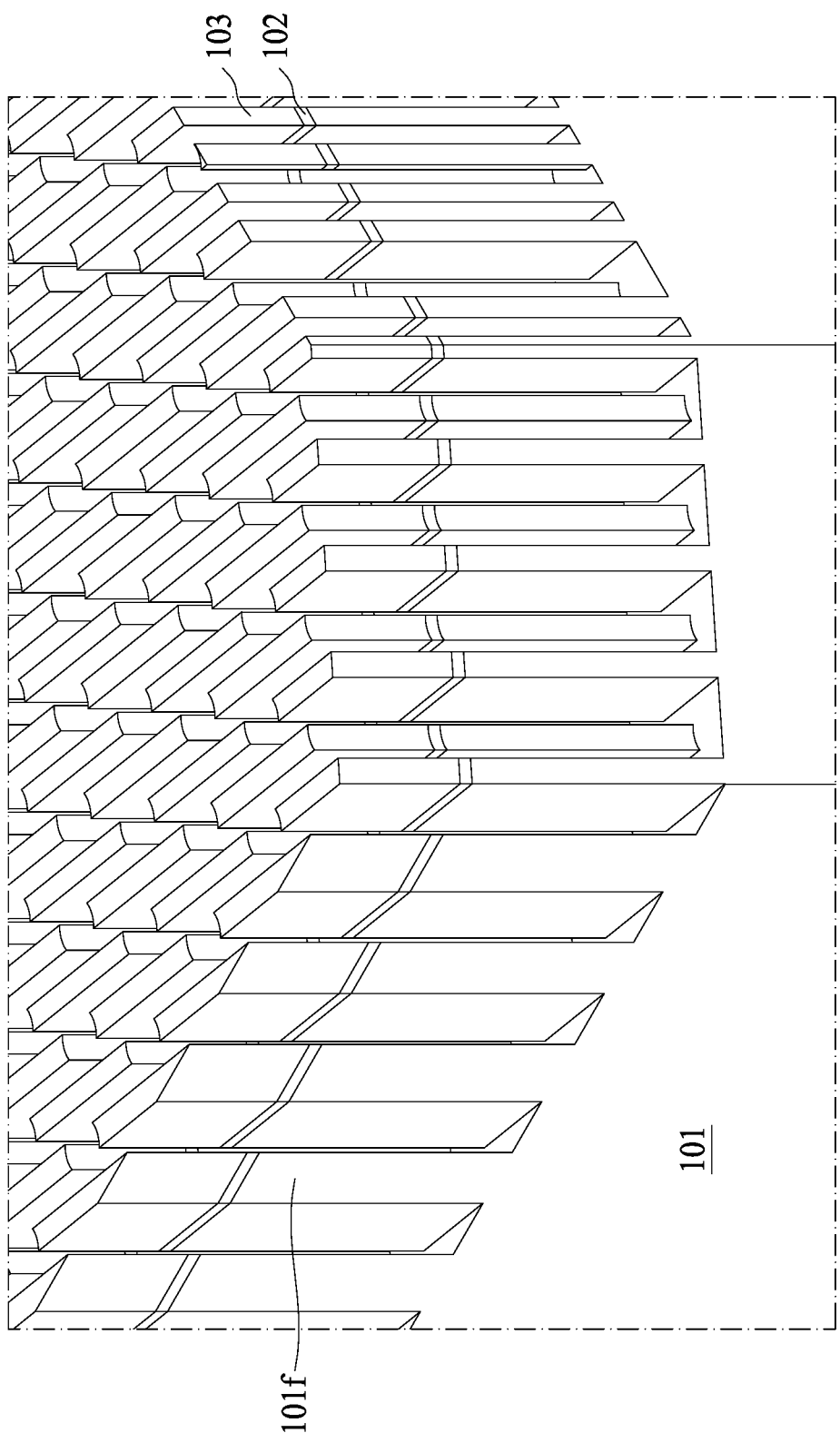
Figure 32:
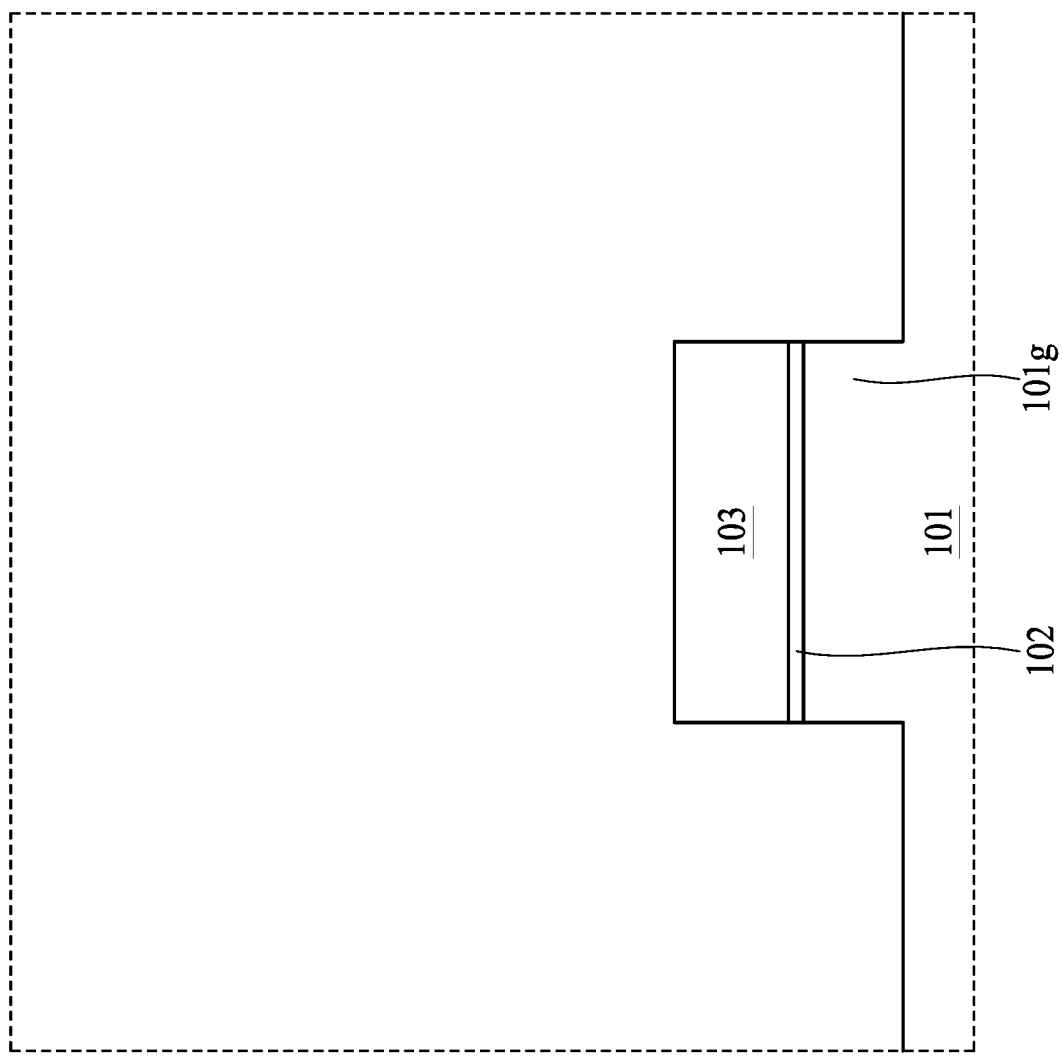

Referring to FIG. 29, the remaining portion of the first layer 105a is removed by dry etching or any other suitable process. In some embodiments, the remaining portion of the first layer 105a is a part of a hardmask stack. In some embodiments, the hardmask stack is removed according to step S209 in FIG. 6. As mentioned above, after the disposing of the second photoresist 112 over the eighth layer 111 as shown in FIG. 15, several removal steps are performed. FIG. 30 illustrates the intermediate structure after the removal steps described above. In some embodiments, the portion DD' in FIG. 15 becomes a portion FF' in FIG. 30, and the portion EE' in FIG. 15 becomes a portion GG' in FIG. 30. FIG. 31 illustrates an enlarged view of the portion FF', and FIG. 32 illustrates an enlarged view of the portion GG'.

Referring to FIG. 30, a second elongated member 101h is formed in a way similar to the above steps of forming the first elongated member 101g or the fins 101f. In some embodiments, the second elongated member 101h is formed between the fins 101f and the first elongated member 101g. In some embodiments, the second elongated member 101h, the first elongated member 101g and the fins 101f are formed simultaneously or sequentially. In some embodiments, the second elongated member 101h has a configuration similar to that of the second elongated member 101h described above or illustrated in FIG. 1.

In some embodiments, several blocks 101i are formed in the peripheral region 101c. In some embodiments, the blocks 101i are formed in a way similar to the above steps of forming the first elongated member 101g or the fins 101f. In some embodiments, the second elongated member 101h, the first elongated member 101g, the fins 101f and the blocks 101i are formed simultaneously or sequentially. In some embodiments, the blocks 101i have a configuration similar to that of the blocks 101i described above or illustrated in FIG. 1.

Figure 33:
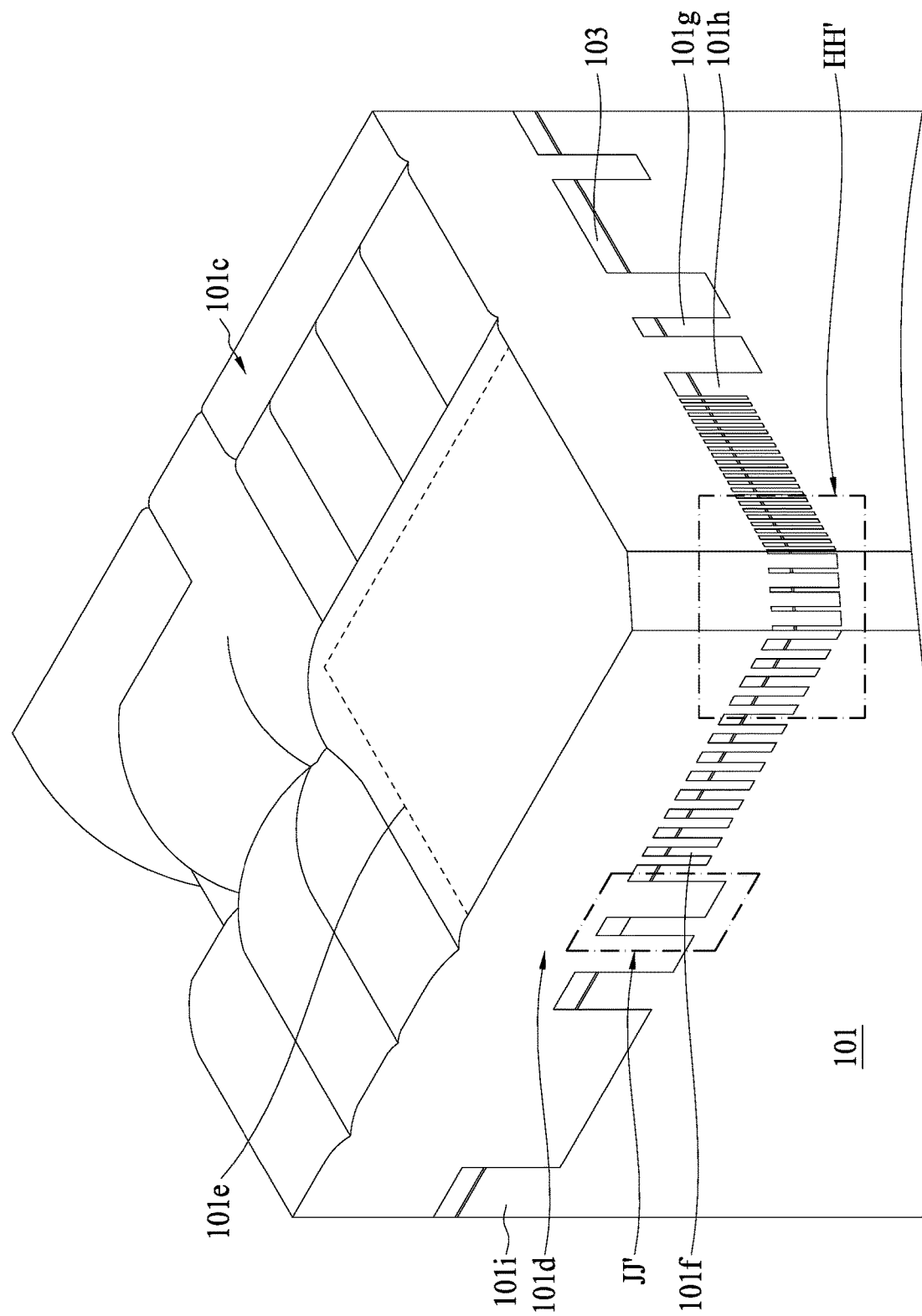
Figure 34:
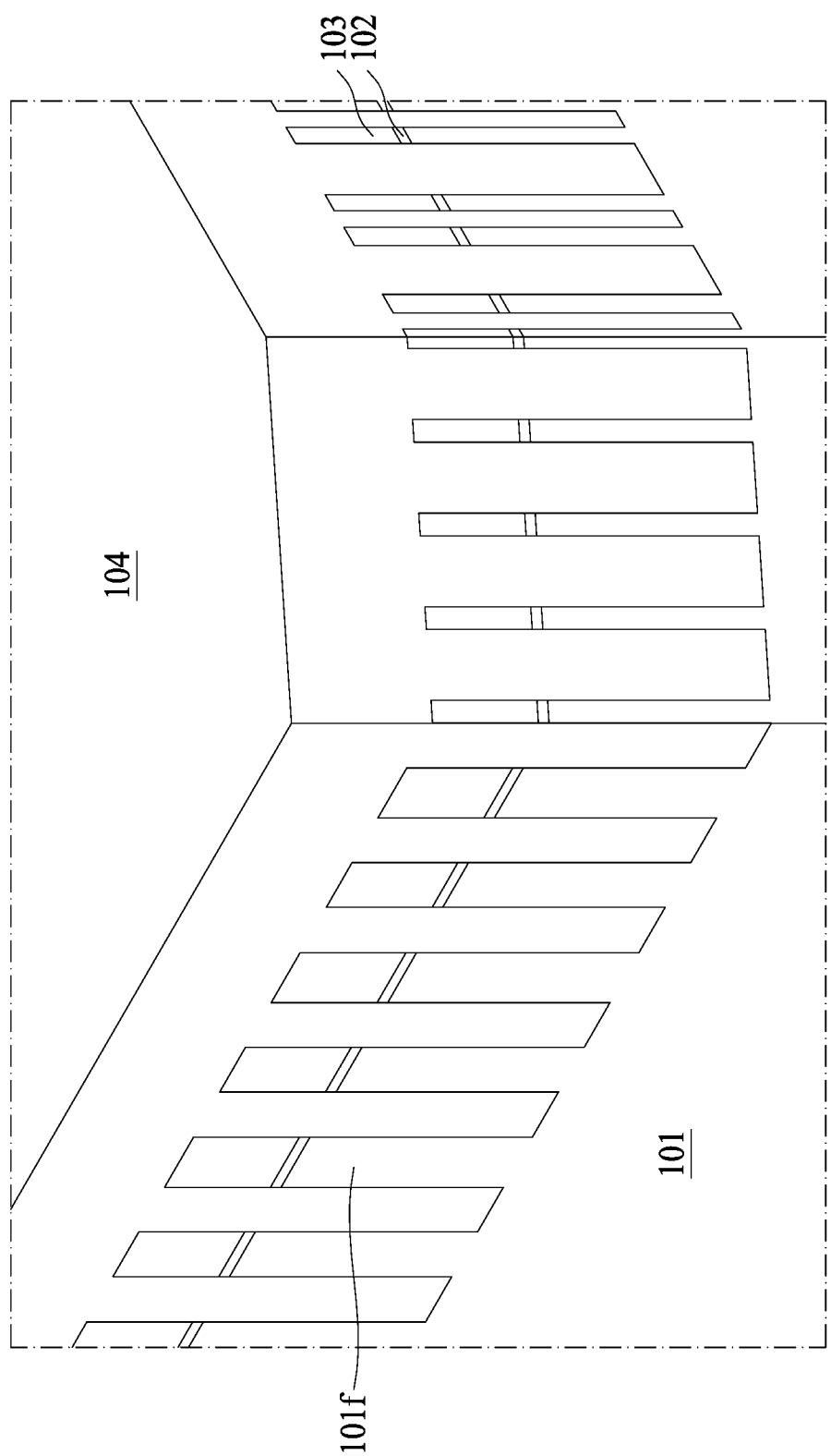
Figure 35:
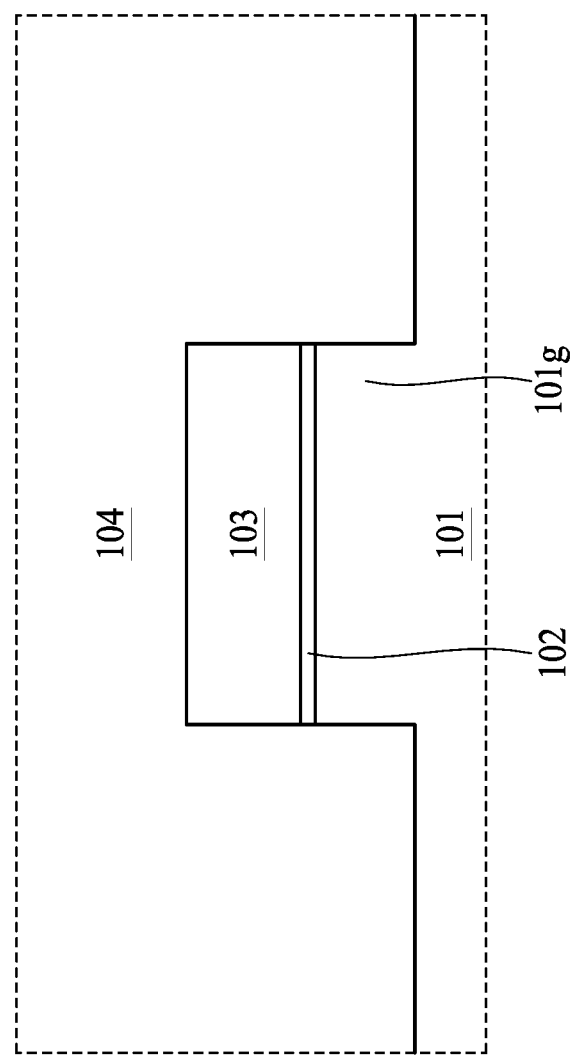

Referring to FIG. 33, FIG. 34 showing an enlarged view of a portion HH' in FIG. 33, and FIG. 35 showing an enlarged view of a portion JJ' in FIG. 33, an isolation 104 is formed over the substrate 101 and surrounding the fins 101f, the first elongated member 101g, the second elongated member 101h and the blocks 101i according to step S210 in FIG. 6. In some embodiments, the isolation 104 is disposed between adjacent fins 101f, between the first elongated member 101g and the second elongated member 101h, and between the fins 101f and the second elongated member 101h.

Figure 36:
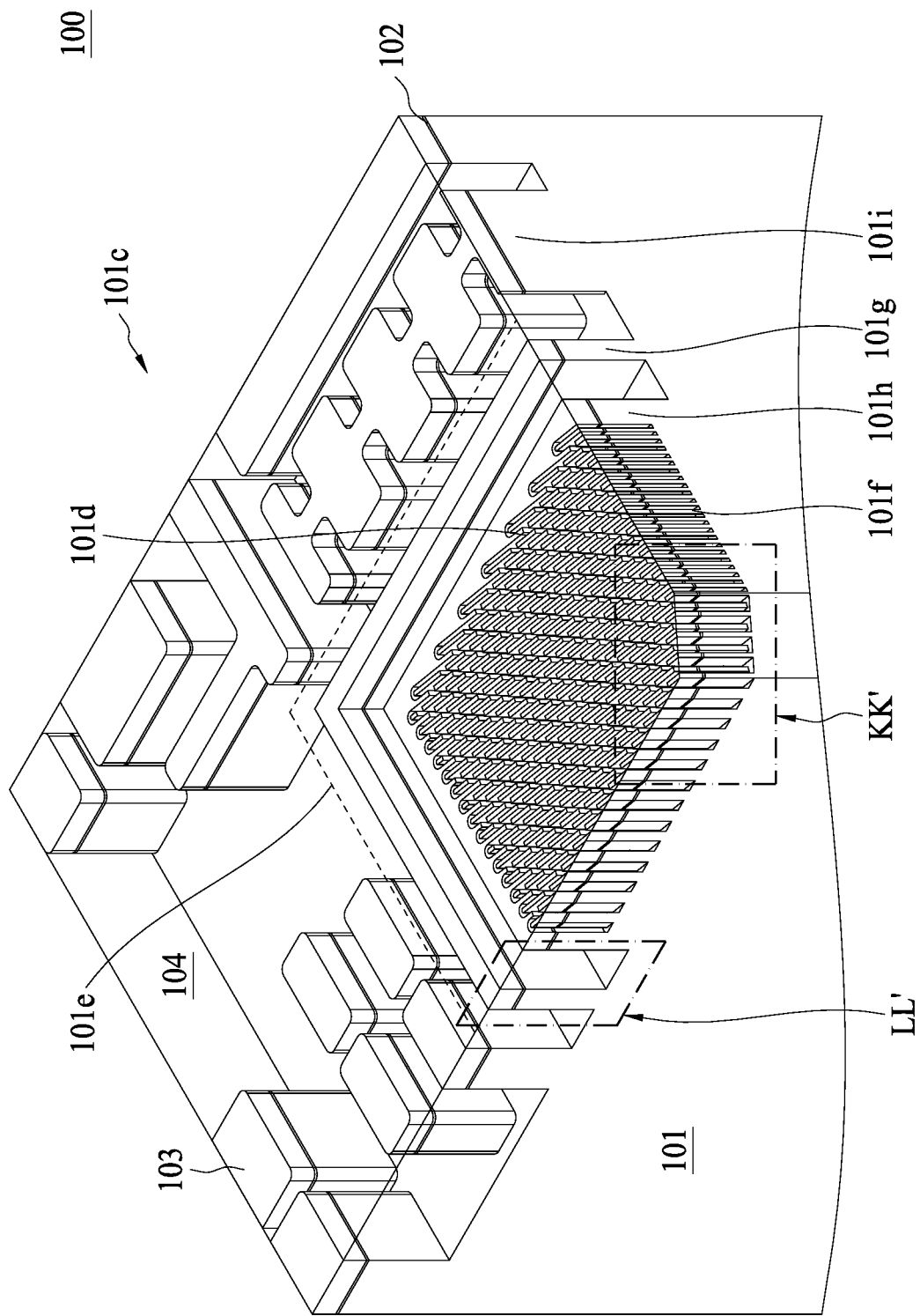
Figure 37:
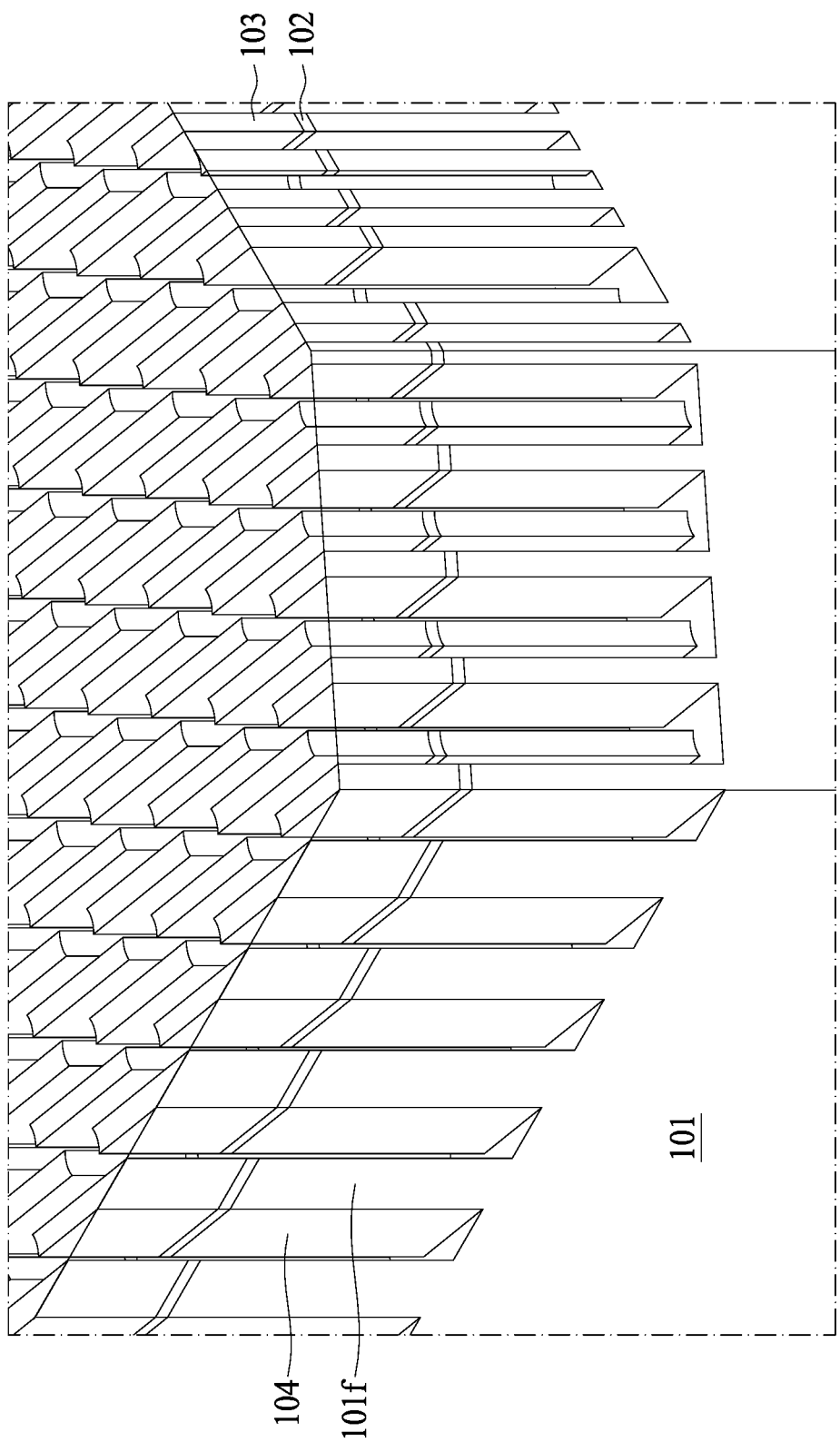
Figure 38:
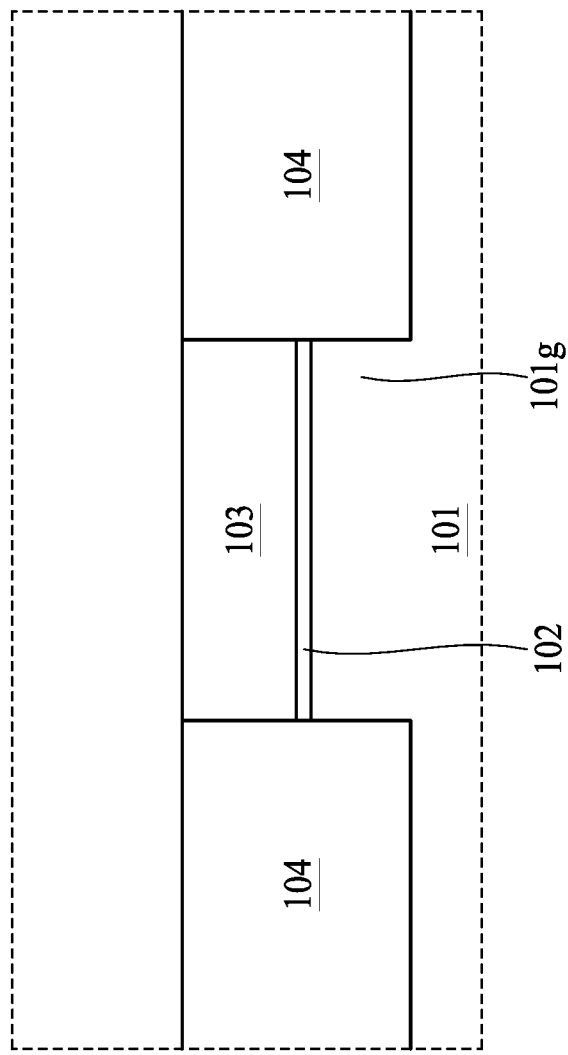

Referring to FIG. 36, FIG. 37 showing an enlarged view of a portion KK' in FIG. 36, and FIG. 38 showing an enlarged view of a portion LL' in FIG. 36, a planarizing process is performed to expose the capping layer 103. In some embodiments, a top surface of the capping layer 103 is exposed through the isolation 104. In some embodiments, the top surface of the capping layer 103 is substantially coplanar with a top surface of the isolation 104. Accordingly, a semiconductor structure 100 as shown in FIG. 1 is formed.

In the present disclosure, a dummy pattern in an elongated configuration is formed to surround fins protruding from a substrate and disposed within an array area. A dummy elongated member is formed over the substrate and configured to relieve internal stress developed in an isolation between the fins in the array area. As such, distortion of the fins in the array area can be minimized. Therefore, reliability and overall performance of the semiconductor structure can be improved.

One aspect of the present disclosure provides a semiconductor structure. The semiconductor structure includes a substrate defined with a peripheral region and an array area at least partially surrounded by the peripheral region, wherein the substrate includes a plurality of fins protruding from the substrate and disposed in the array area, and a first elongated member protruding from the substrate and at least partially surrounding the plurality of fins; an insulating layer disposed over the plurality of fins and the first elongated member; a capping layer disposed over the insulating layer; and an isolation surrounding the plurality of fins, the first elongated member, the insulating layer and the capping layer.

Another aspect of the present disclosure provides a method of manufacturing a semiconductor structure. The method includes steps of providing a substrate defined with a peripheral region and an array area at least partially surrounded by the peripheral region; disposing an insulating layer over the substrate; disposing a capping layer over the insulating layer; disposing a hardmask stack on the capping layer; patterning the hardmask stack; removing portions of the capping layer exposed through the hardmask stack; removing portions of the insulating layer exposed through the hardmask stack; removing portions of the substrate exposed through the capping layer and the insulating layer to form a plurality of fins in the array area and a first elongated member at least partially surrounding the plurality of fins; removing the hardmask stack; and forming an isolation over the substrate and surrounding the plurality of fins and the first elongated member.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:
   providing a substrate defined with a peripheral region and an array area at least partially surrounded by the peripheral region;
   disposing an insulating layer over the substrate;
   disposing a capping layer over the insulating layer;
   disposing a hardmask stack on the capping layer;
   patterning the hardmask stack;
   removing portions of the capping layer exposed through the hardmask stack;
   removing portions of the insulating layer exposed through the hardmask stack;
   removing portions of the substrate exposed through the capping layer and the insulating layer to form a plurality of fins in the array area and a first elongated member at least partially surrounding the plurality of fins;
   removing the hardmask stack; and
   forming an isolation over the substrate and surrounding the plurality of fins and the first elongated member.

2. The method of claim 1, wherein the formation of the isolation includes performing a planarizing process to expose a top surface of the capping layer through the isolation.

3. The method of claim 2, wherein the top surface of the capping layer is substantially coplanar with a top surface of the isolation.

4. The method of claim 1, wherein the patterning of the hardmask stack includes disposing a photoresist over the hardmask stack, and removing portions of the hardmask stack exposed through the photoresist.

5. The method of claim 1, further comprising removing portions of the substrate exposed through the capping layer and the insulating layer to form a second elongated member between the plurality of fins and the first elongated member.

6. The method of claim 5, wherein the plurality of fins, the first elongated member and the second elongated member are formed simultaneously.

7. The method of claim 1, wherein the first elongated member has a width in a range between 150 nm and 1000 nm.

8. The method of claim 1, wherein the first elongated member extends along a boundary between the peripheral region and the array area.

9. The method of claim 8, wherein the substrate includes a second elongated member protruding from the substrate and at least partially surrounding the plurality of fins.

10. The method of claim 9, wherein the second elongated member is disposed between the first elongated member and the plurality of fins.

11. The method of claim 9, wherein the second elongated member is at least partially disposed between two of the plurality of fins.

12. The method of claim 9, wherein the isolation is disposed between the first elongated member and the second elongated member.

13. The method of claim 9, wherein the plurality of fins, the first elongated member and the second elongated member are integrally formed.

14. The method of claim 1, wherein the isolation is disposed between two of the plurality of fins.

15. The method of claim 1, wherein the substrate includes a plurality of blocks protruding from the substrate, disposed in the peripheral region, covered by the capping layer and surrounded by the isolation.

16. The method of claim 1, wherein the first elongated member is a dummy pattern.

17. The method of claim 1, wherein the insulating layer and the isolation include oxide, and the capping layer includes nitride.

18. The method of claim 15, wherein the plurality of fins, the first elongated member and the plurality of blocks are integrally formed.

* * * * *